(12) United States Patent
Shiratake

(10) Patent No.: US 9,778,978 B2
(45) Date of Patent: Oct. 3, 2017

(54) MEMORY DEVICE AND MEMORY SYSTEM WITH SENSOR

(71) Applicant: TOSHIBA MEMORY CORPORATION, Minato-ku, Tokyo (JP)

(72) Inventor: Shinichiro Shiratake, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 14/935,083

(22) Filed: Nov. 6, 2015

(65) Prior Publication Data

US 2016/0062825 A1 Mar. 3, 2016

Related U.S. Application Data

(60) Division of application No. 14/460,021, filed on Aug. 14, 2014, now abandoned, which is a continuation-in-part of application No. 14/198,398, filed on Mar. 5, 2014, now Pat. No. 9,218,867.

(60) Provisional application No. 61/869,293, filed on Aug. 23, 2013.

(51) Int. Cl.
G11C 29/00 (2006.01)
G06F 11/10 (2006.01)
G11C 11/16 (2006.01)
G11C 5/14 (2006.01)
G11C 8/10 (2006.01)
G11C 11/418 (2006.01)
G11C 16/12 (2006.01)
H03M 13/05 (2006.01)
H03M 13/00 (2006.01)

(52) U.S. Cl.
CPC .......... *G06F 11/1008* (2013.01); *G11C 5/148* (2013.01); *G11C 8/10* (2013.01); *G11C 11/1653* (2013.01); *G11C 11/1675* (2013.01); *G11C 11/1697* (2013.01); *G11C 11/418* (2013.01); *G11C 16/12* (2013.01); *H03M 13/05* (2013.01); *H03M 13/611* (2013.01)

(58) Field of Classification Search
None
See application file for complete search history.

(56) References Cited

U.S. PATENT DOCUMENTS

| | | | |
|---|---|---|---|
| 6,389,490 B1 | 5/2002 | Camilleri et al. | |
| 6,961,891 B2 * | 11/2005 | Murillo | H03M 13/6502 714/763 |
| 7,529,139 B2 | 5/2009 | Huang et al. | |
| 7,916,048 B2 | 3/2011 | Basappa et al. | |
| 8,094,511 B2 | 1/2012 | Lee et al. | |
| 2003/0046635 A1 * | 3/2003 | Murillo | H03M 13/19 714/781 |
| 2006/0209585 A1 | 9/2006 | Tanizaki et al. | |

(Continued)

*Primary Examiner* — M. Mujtaba Chaudry
(74) *Attorney, Agent, or Firm* — Holtz, Holtz & Volek PC

(57) ABSTRACT

According to one embodiment, a memory device includes a first address memory storing a first address; a controller which is based on a first interface which transmits a signal serially and outputs a first command in accordance with the first interface; and a memory which stores data in a non-volatile manner, is based on the first interface, and stores received write data in an address based on the first address when the memory receives the first command.

7 Claims, 32 Drawing Sheets

(56) References Cited

U.S. PATENT DOCUMENTS

| | | | |
|---|---|---|---|
| 2008/0028271 A1* | 1/2008 | Chen | H03M 13/033 |
| | | | 714/752 |
| 2008/0151678 A1 | 6/2008 | Ikeda et al. | |
| 2008/0181040 A1 | 7/2008 | Huang et al. | |
| 2008/0250295 A1* | 10/2008 | Yamagishi | H03M 13/116 |
| | | | 714/757 |
| 2009/0122598 A1 | 5/2009 | Toda et al. | |
| 2009/0201717 A1 | 8/2009 | Maeda et al. | |
| 2009/0323395 A1 | 12/2009 | Ueda | |
| 2010/0067311 A1 | 3/2010 | Lee et al. | |
| 2010/0134332 A1 | 6/2010 | Basappa et al. | |
| 2012/0117448 A1* | 5/2012 | Kern | H03M 13/152 |
| | | | 714/785 |
| 2014/0281790 A1* | 9/2014 | Li | H03M 13/1171 |
| | | | 714/755 |

* cited by examiner

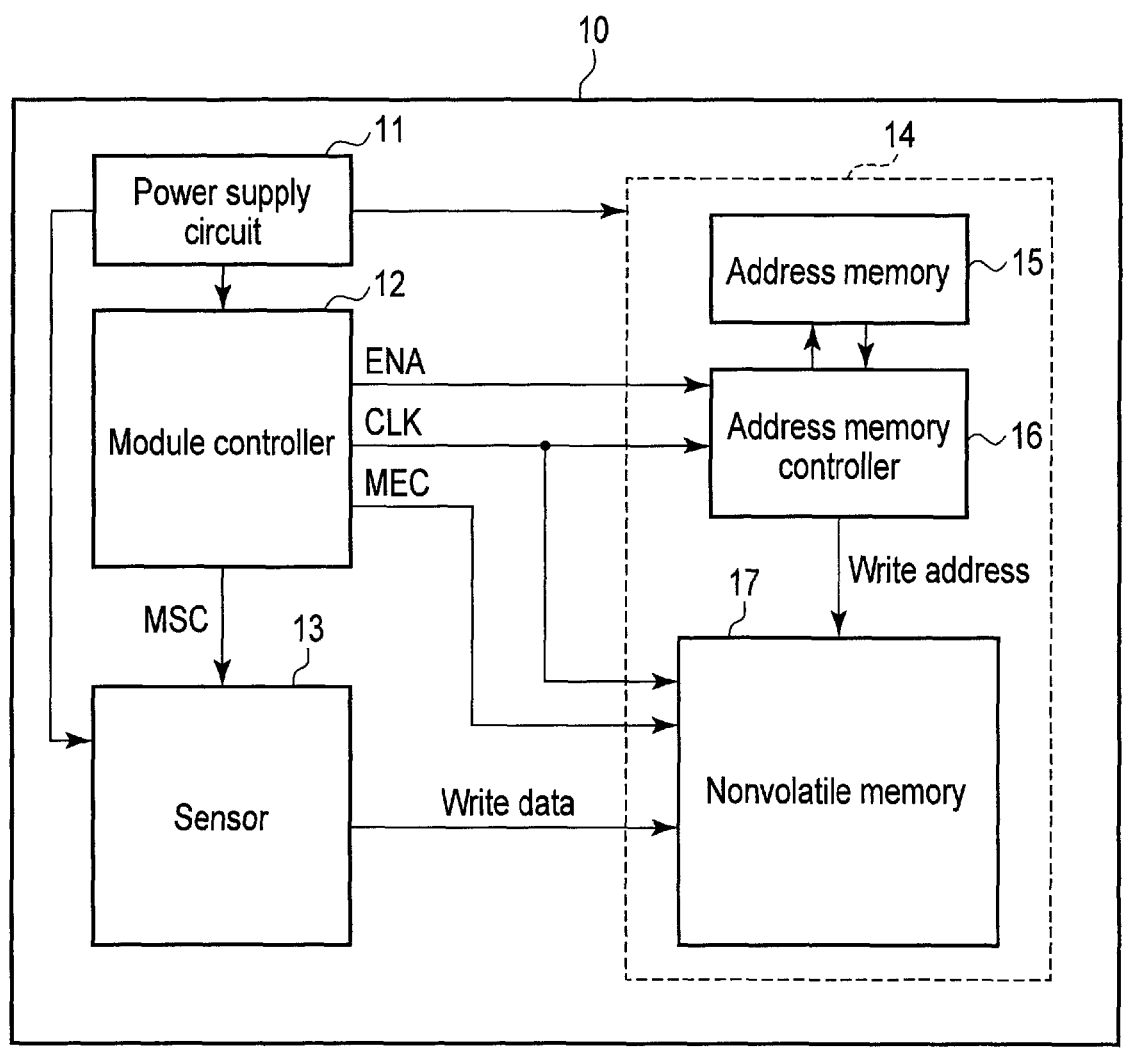
F I G. 1

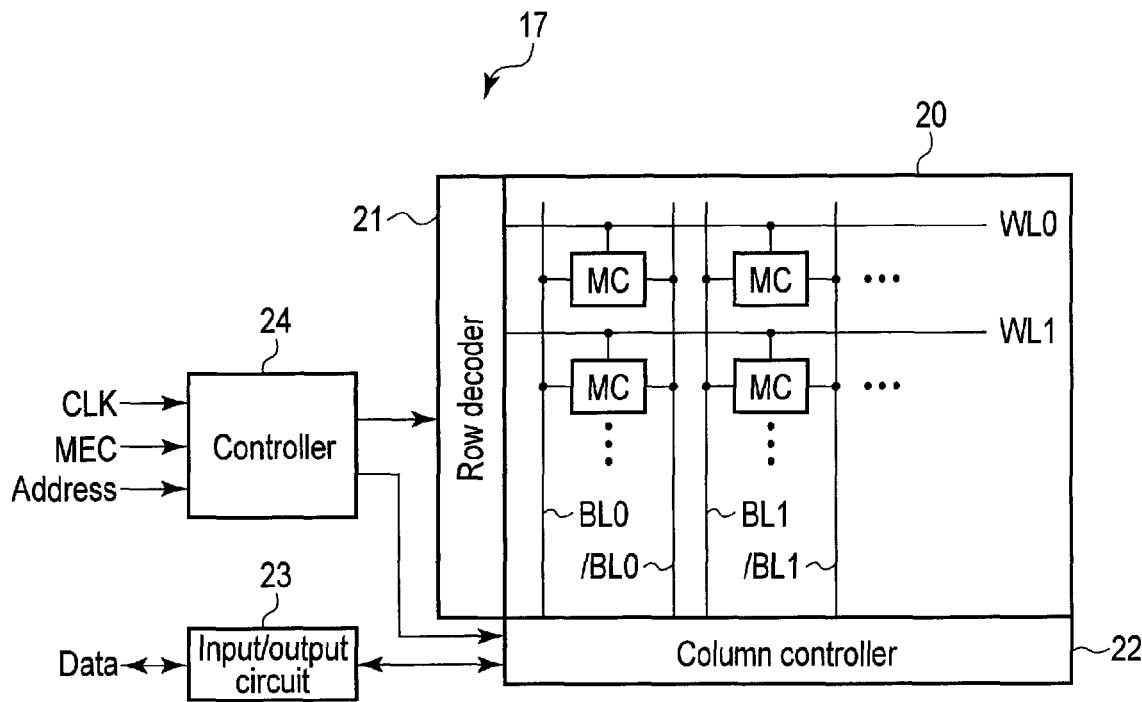
F I G. 2
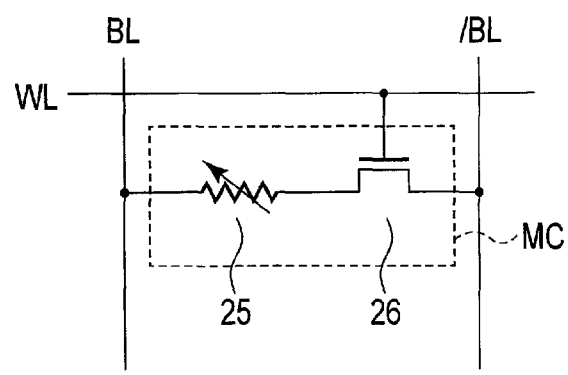
F I G. 3

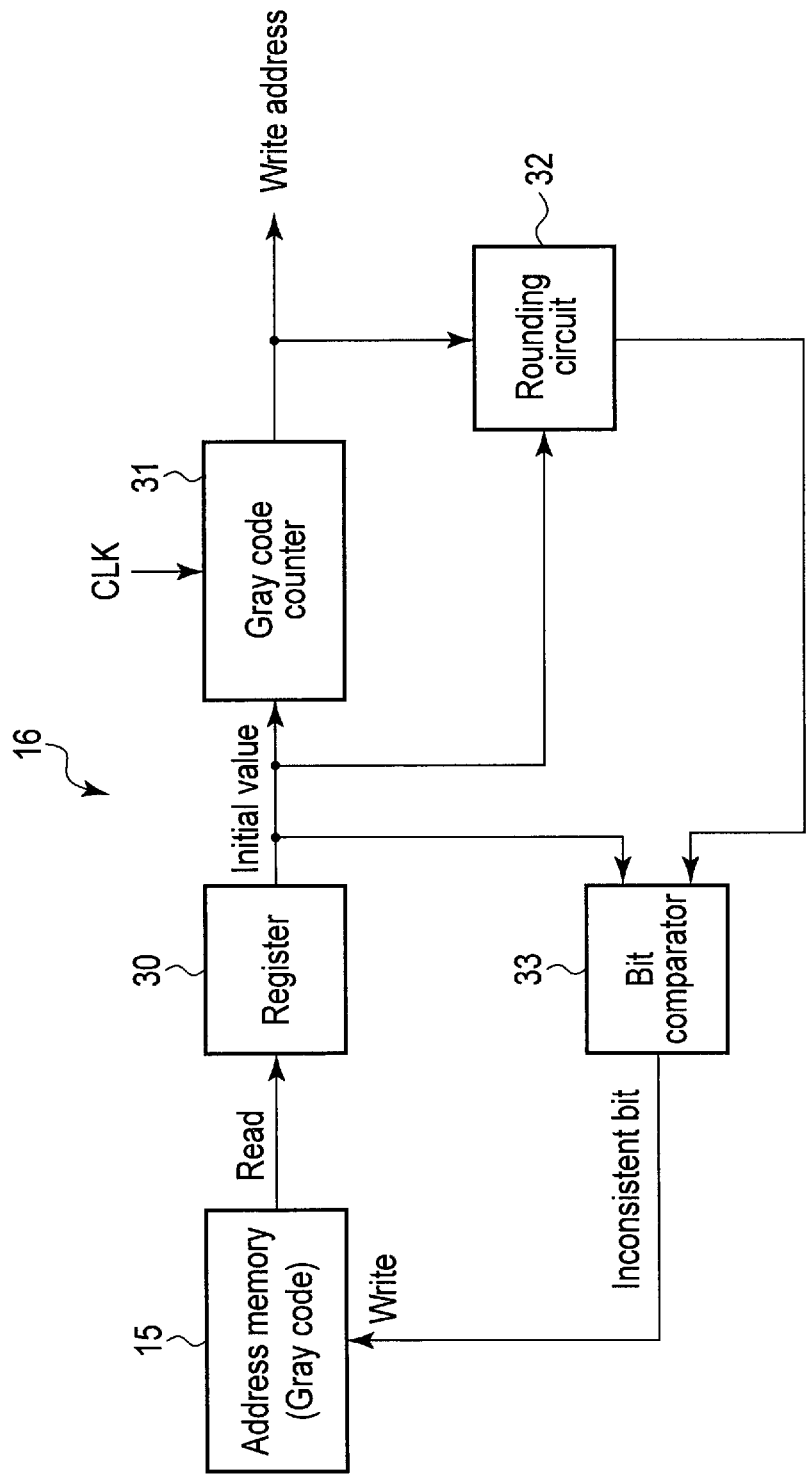
F I G. 4

| Binary | | | | | | | | Decimal | Gray code | | | | | | | |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 1 | 0 | 0 | 0 | 0 | 0 | 0 | 0 | 1 |
| 0 | 0 | 0 | 0 | 0 | 0 | 1 | 0 | 2 | 0 | 0 | 0 | 0 | 0 | 0 | 1 | 1 |
| 0 | 0 | 0 | 0 | 0 | 0 | 1 | 1 | 3 | 0 | 0 | 0 | 0 | 0 | 0 | 1 | 0 |
| 0 | 0 | 0 | 0 | 0 | 1 | 0 | 0 | 4 | 0 | 0 | 0 | 0 | 0 | 1 | 1 | 0 |
| 0 | 0 | 0 | 0 | 0 | 1 | 0 | 1 | 5 | 0 | 0 | 0 | 0 | 0 | 1 | 1 | 1 |
| 0 | 0 | 0 | 0 | 0 | 1 | 1 | 0 | 6 | 0 | 0 | 0 | 0 | 0 | 1 | 0 | 1 |
| 0 | 0 | 0 | 0 | 0 | 1 | 1 | 1 | 7 | 0 | 0 | 0 | 0 | 0 | 1 | 0 | 0 |
| 0 | 0 | 0 | 0 | 1 | 0 | 0 | 0 | 8 | 0 | 0 | 0 | 0 | 1 | 1 | 0 | 0 |
| 0 | 0 | 0 | 0 | 1 | 0 | 0 | 1 | 9 | 0 | 0 | 0 | 0 | 1 | 1 | 0 | 1 |
| 0 | 0 | 0 | 0 | 1 | 0 | 1 | 0 | 10 | 0 | 0 | 0 | 0 | 1 | 1 | 1 | 1 |
| 0 | 0 | 0 | 0 | 1 | 0 | 1 | 1 | 11 | 0 | 0 | 0 | 0 | 1 | 1 | 1 | 0 |
| 0 | 0 | 0 | 0 | 1 | 1 | 0 | 0 | 12 | 0 | 0 | 0 | 0 | 1 | 0 | 1 | 0 |
| 0 | 0 | 0 | 0 | 1 | 1 | 0 | 1 | 13 | 0 | 0 | 0 | 0 | 1 | 0 | 1 | 1 |
| 0 | 0 | 0 | 0 | 1 | 1 | 1 | 0 | 14 | 0 | 0 | 0 | 0 | 1 | 0 | 0 | 1 |
| 0 | 0 | 0 | 0 | 1 | 1 | 1 | 1 | 15 | 0 | 0 | 0 | 0 | 1 | 0 | 0 | 0 |
| 0 | 0 | 0 | 1 | 0 | 0 | 0 | 0 | 16 | 0 | 0 | 0 | 1 | 1 | 0 | 0 | 0 |
| 0 | 0 | 0 | 1 | 0 | 0 | 0 | 1 | 17 | 0 | 0 | 0 | 1 | 1 | 0 | 0 | 1 |
| 0 | 0 | 0 | 1 | 0 | 0 | 1 | 0 | 18 | 0 | 0 | 0 | 1 | 1 | 0 | 1 | 1 |
| 0 | 0 | 0 | 1 | 0 | 0 | 1 | 1 | 19 | 0 | 0 | 0 | 1 | 1 | 0 | 1 | 0 |
| 0 | 0 | 0 | 1 | 0 | 1 | 0 | 0 | 20 | 0 | 0 | 0 | 1 | 1 | 1 | 1 | 0 |
| 0 | 0 | 0 | 1 | 0 | 1 | 0 | 1 | 21 | 0 | 0 | 0 | 1 | 1 | 1 | 1 | 1 |
| 0 | 0 | 0 | 1 | 0 | 1 | 1 | 0 | 22 | 0 | 0 | 0 | 1 | 1 | 1 | 0 | 1 |
| 0 | 0 | 0 | 1 | 0 | 1 | 1 | 1 | 23 | 0 | 0 | 0 | 1 | 1 | 1 | 0 | 0 |
| 0 | 0 | 0 | 1 | 1 | 0 | 0 | 0 | 24 | 0 | 0 | 0 | 1 | 0 | 1 | 0 | 0 |
| 0 | 0 | 0 | 1 | 1 | 0 | 0 | 1 | 25 | 0 | 0 | 0 | 1 | 0 | 1 | 0 | 1 |
| 0 | 0 | 0 | 1 | 1 | 0 | 1 | 0 | 26 | 0 | 0 | 0 | 1 | 0 | 1 | 1 | 1 |
| 0 | 0 | 0 | 1 | 1 | 0 | 1 | 1 | 27 | 0 | 0 | 0 | 1 | 0 | 1 | 1 | 0 |
| 0 | 0 | 0 | 1 | 1 | 1 | 0 | 0 | 28 | 0 | 0 | 0 | 1 | 0 | 0 | 1 | 0 |
| 0 | 0 | 0 | 1 | 1 | 1 | 0 | 1 | 29 | 0 | 0 | 0 | 1 | 0 | 0 | 1 | 1 |
| 0 | 0 | 0 | 1 | 1 | 1 | 1 | 0 | 30 | 0 | 0 | 0 | 1 | 0 | 0 | 0 | 1 |
| 0 | 0 | 0 | 1 | 1 | 1 | 1 | 1 | 31 | 0 | 0 | 0 | 1 | 0 | 0 | 0 | 0 |
| 0 | 0 | 1 | 0 | 0 | 0 | 0 | 0 | 32 | 0 | 0 | 1 | 1 | 0 | 0 | 0 | 0 |
| 0 | 0 | 1 | 0 | 0 | 0 | 0 | 1 | 33 | 0 | 0 | 1 | 1 | 0 | 0 | 0 | 1 |
| 0 | 0 | 1 | 0 | 0 | 0 | 1 | 0 | 34 | 0 | 0 | 1 | 1 | 0 | 0 | 1 | 1 |
| 0 | 0 | 1 | 0 | 0 | 0 | 1 | 1 | 35 | 0 | 0 | 1 | 1 | 0 | 0 | 1 | 0 |

FIG. 5

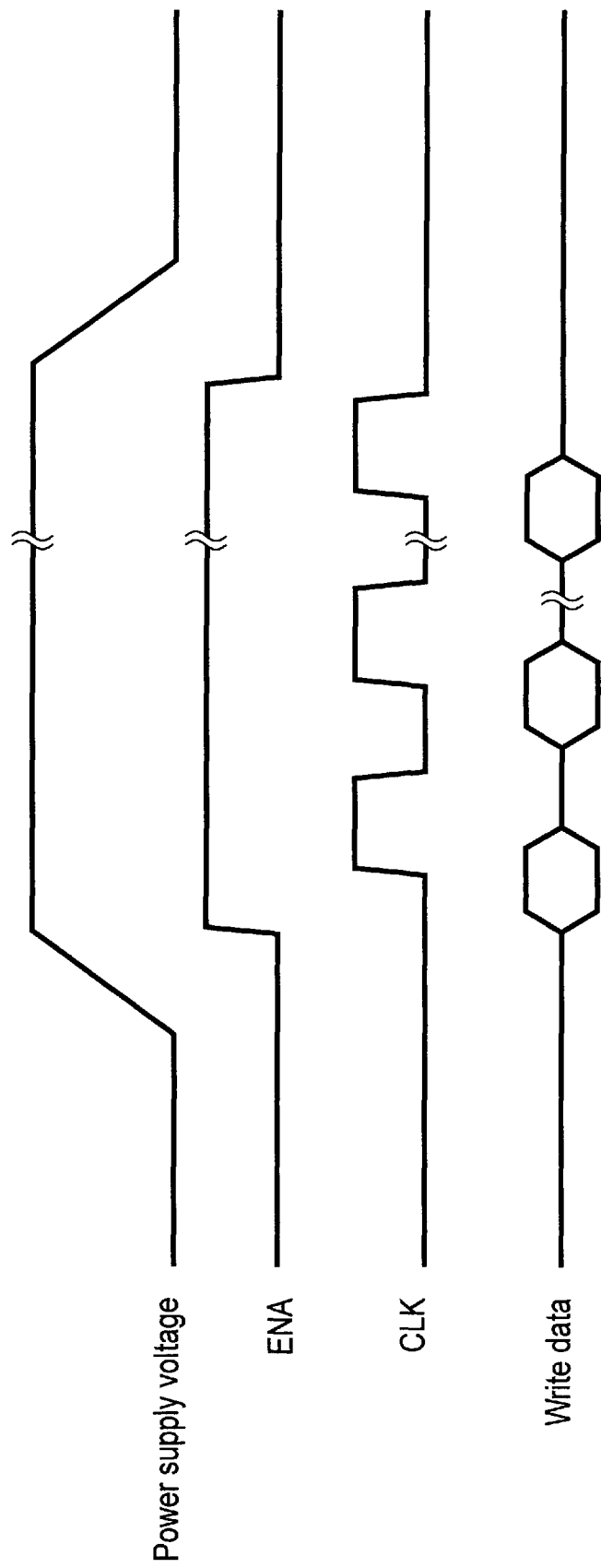
F I G. 6

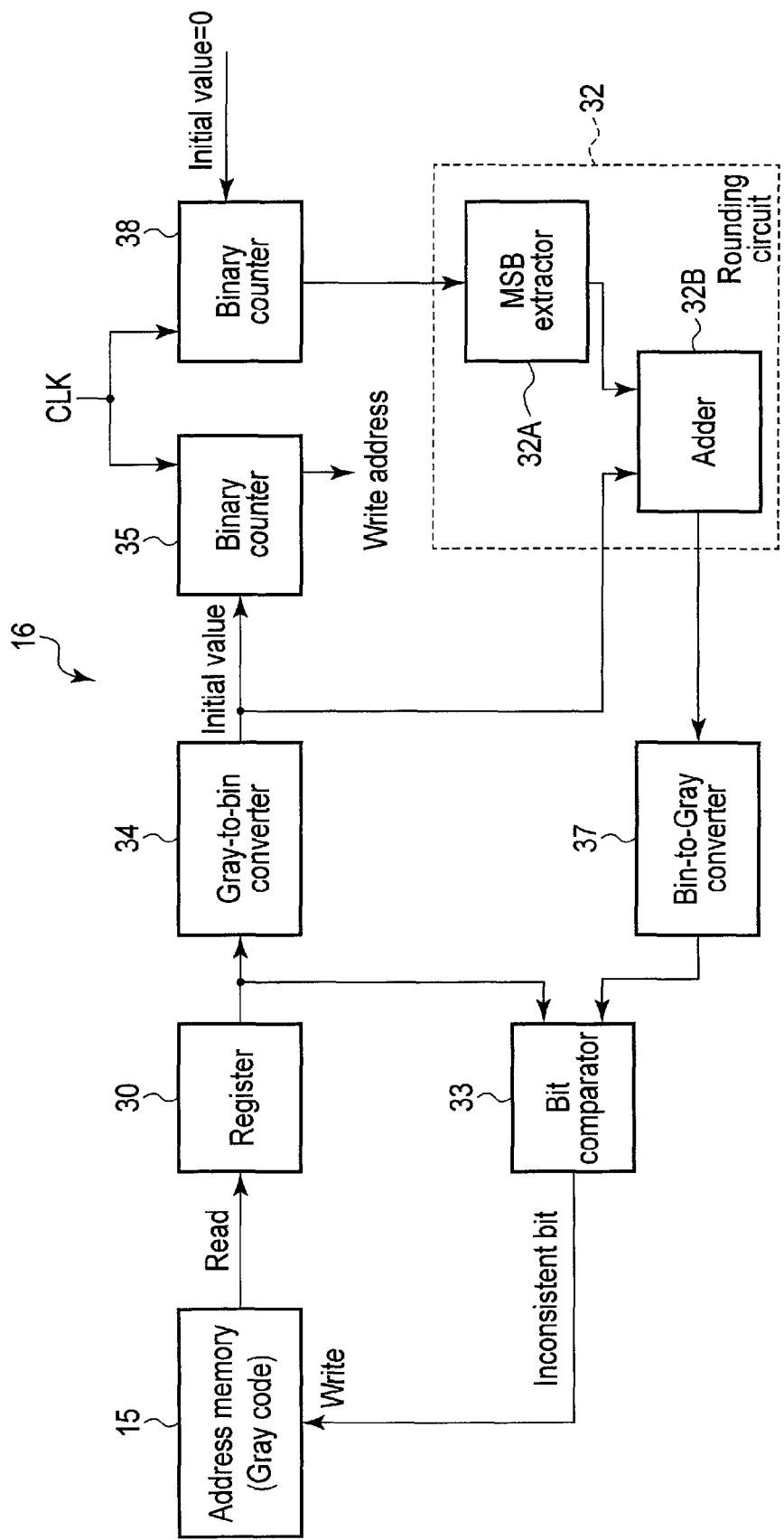
F I G. 8

| Input | Output |
|---|---|
| 0001 | 0001 |
| 0010 | 0010 |
| 0011 | 0100 |
| 0100 | 0100 |
| 0101 | 1000 |
| 0110 | 1000 |
| 0111 | 1000 |
| 1000 | 1000 |

F I G. 9

| Input | Output |
|-------|--------|
| 0000  | 0001   |
| 0001  | 0010   |
| 0010  | 0100   |
| 0011  | 0100   |
| 0100  | 1000   |
| 0101  | 1000   |
| 0110  | 1000   |
| 0111  | 1000   |

F I G. 12

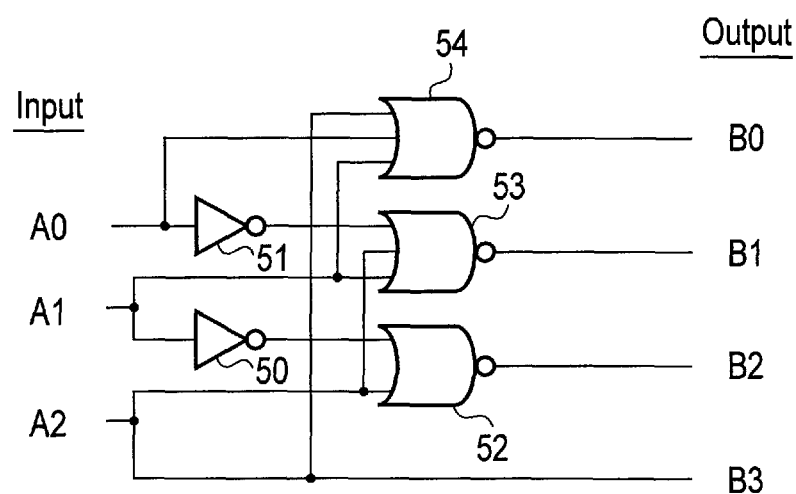
F I G. 14

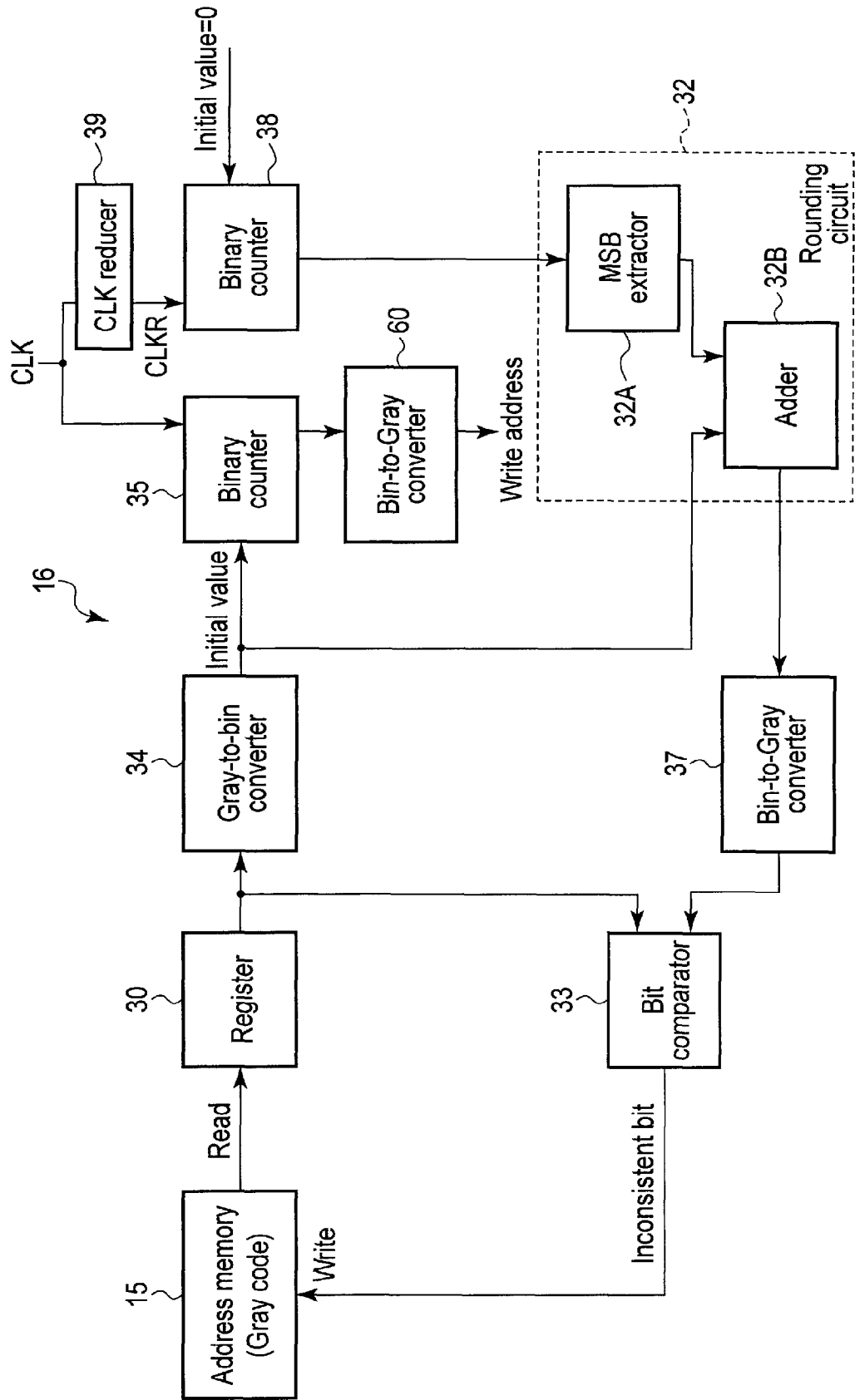
F I G. 15

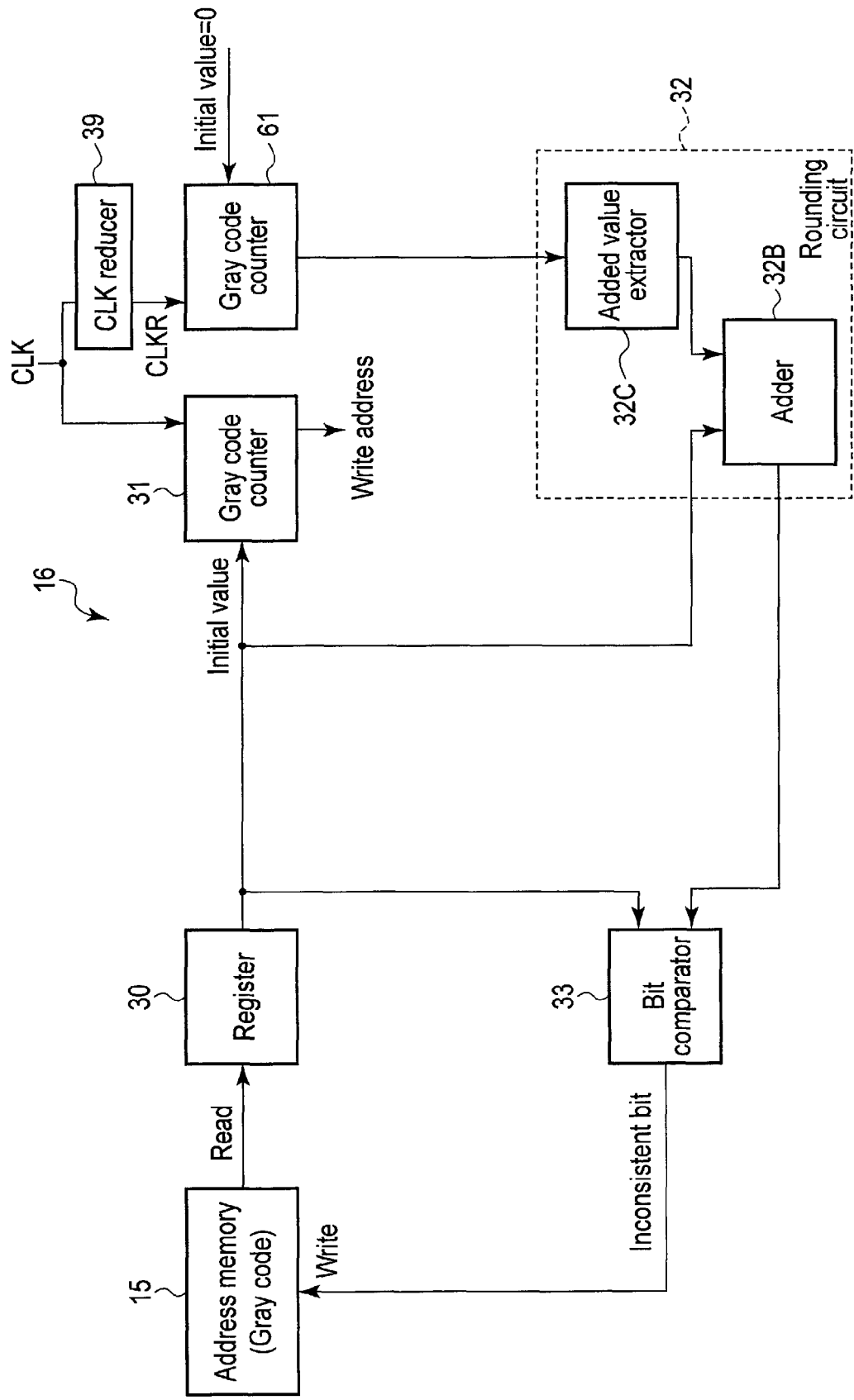
F I G. 16

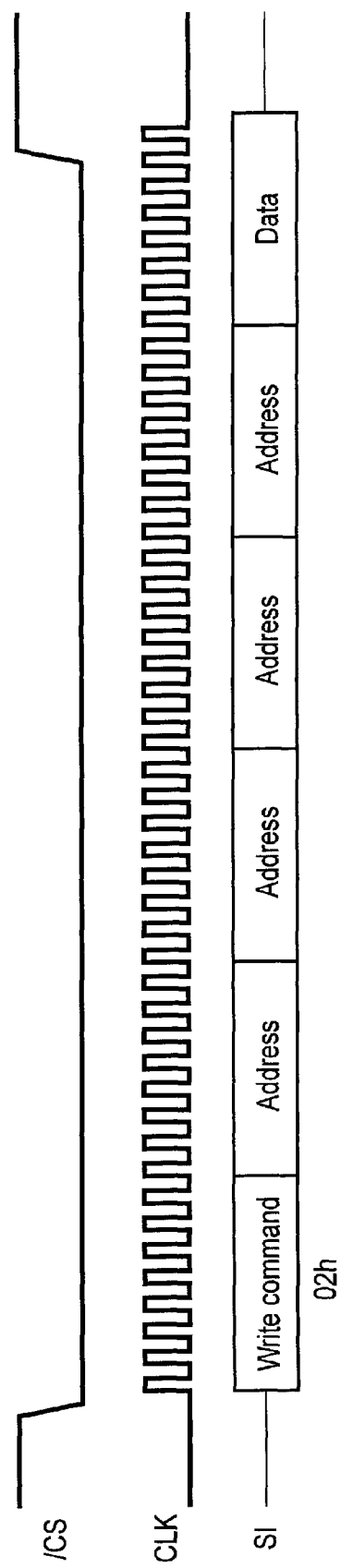
F I G. 20

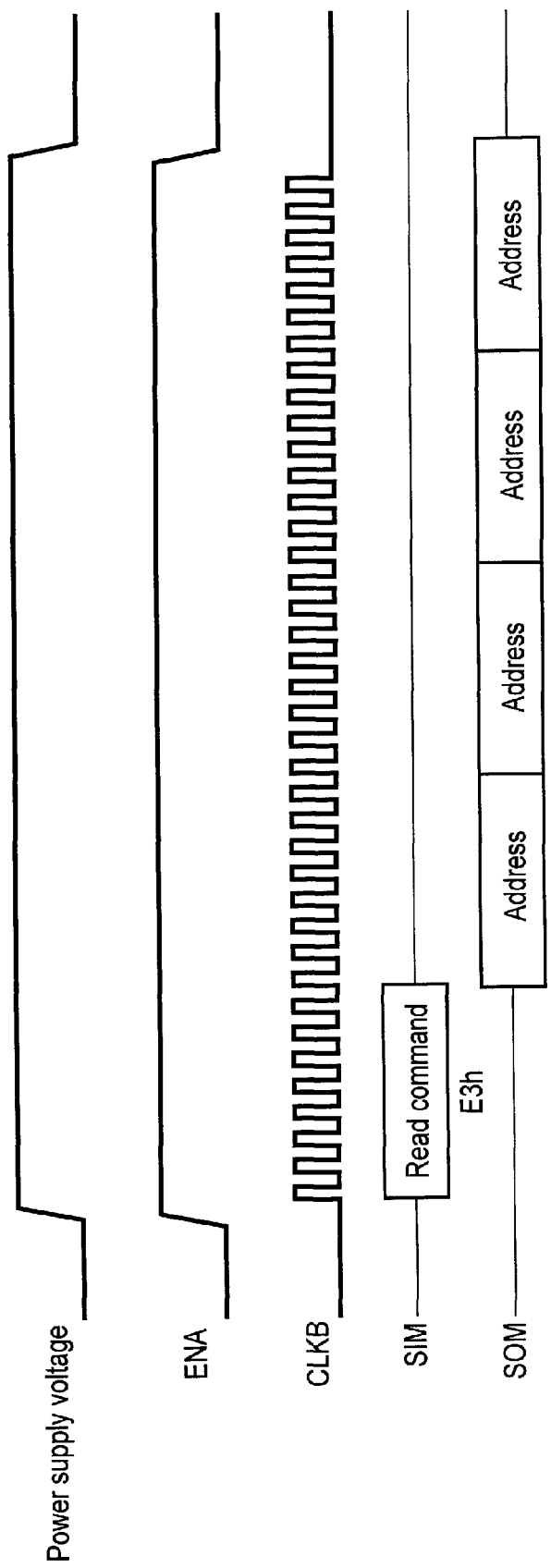
F I G. 24

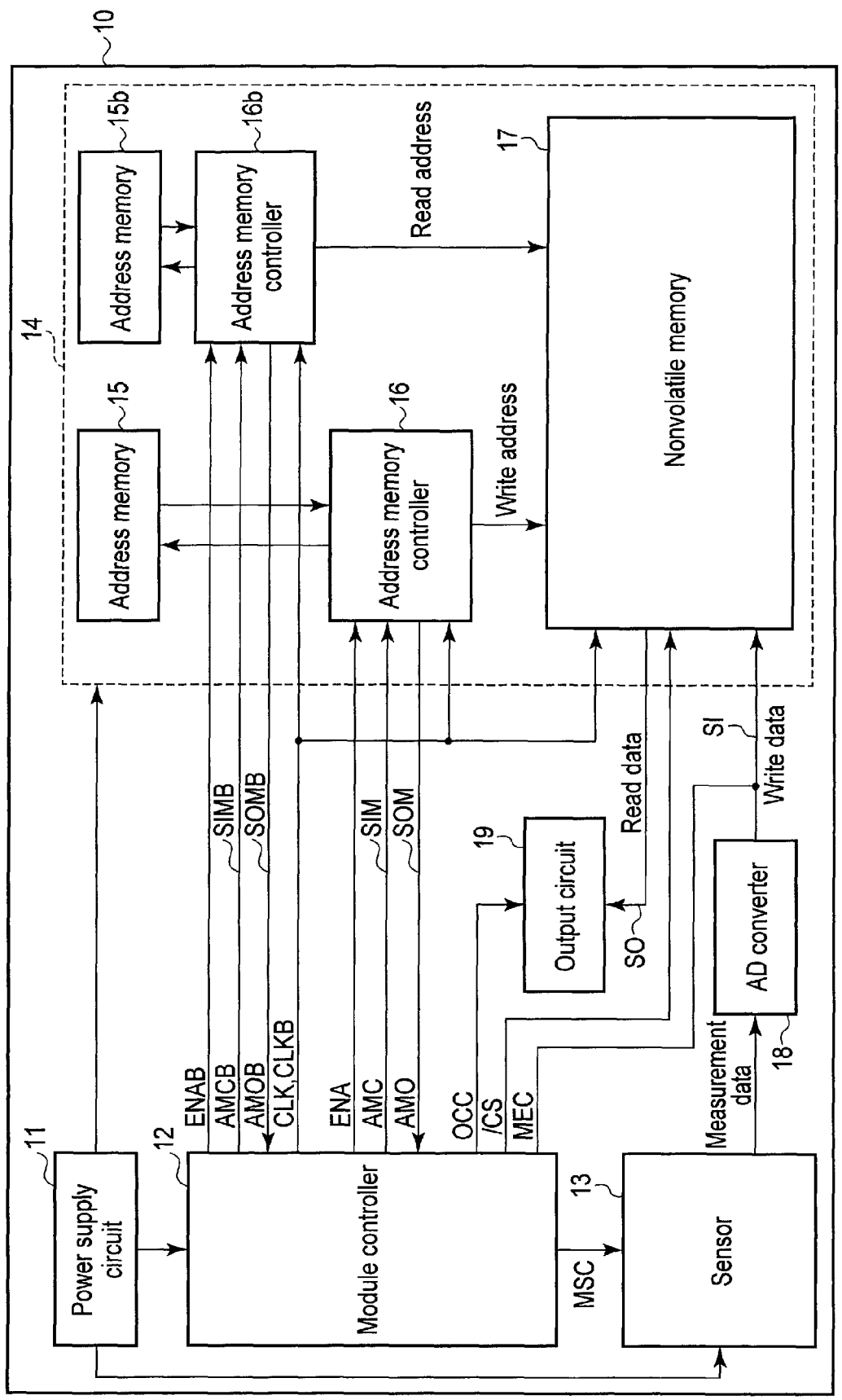
F I G. 25

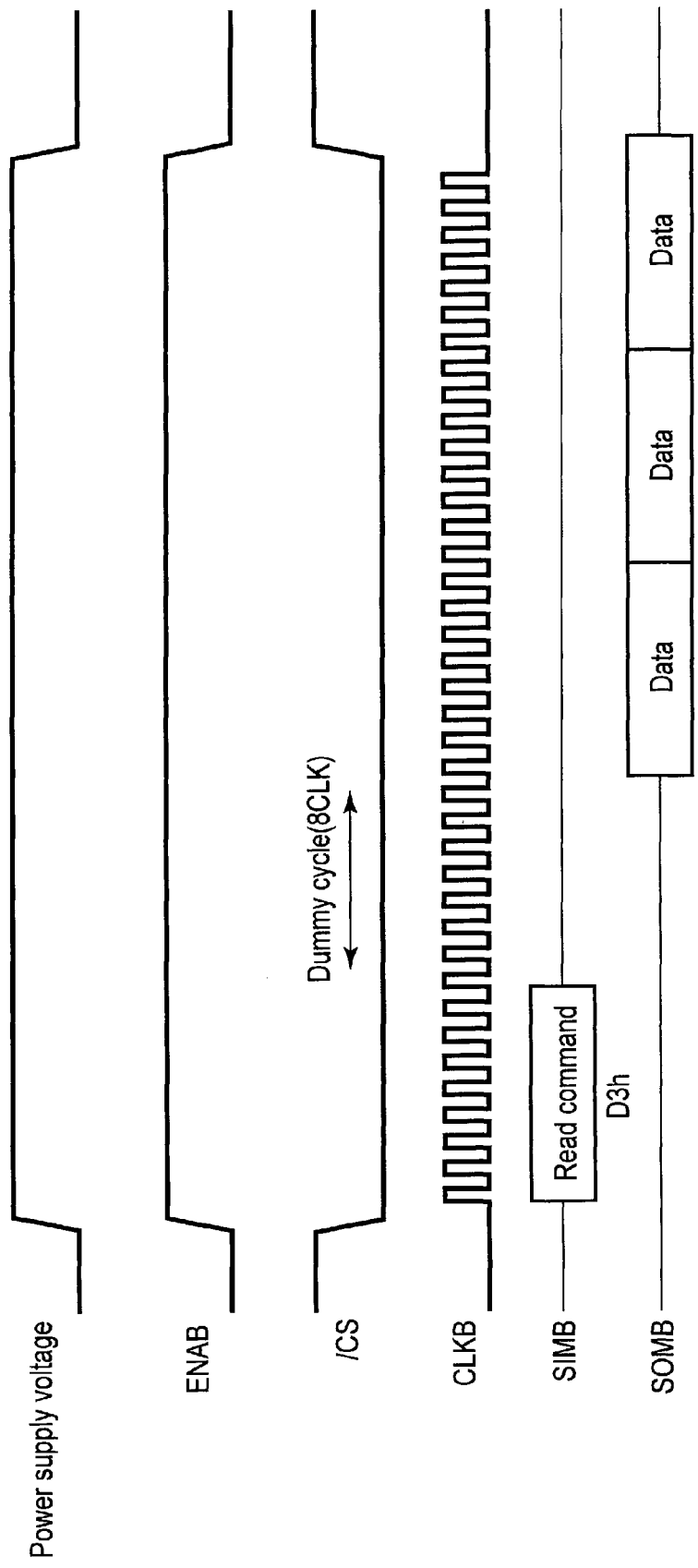
F I G. 27

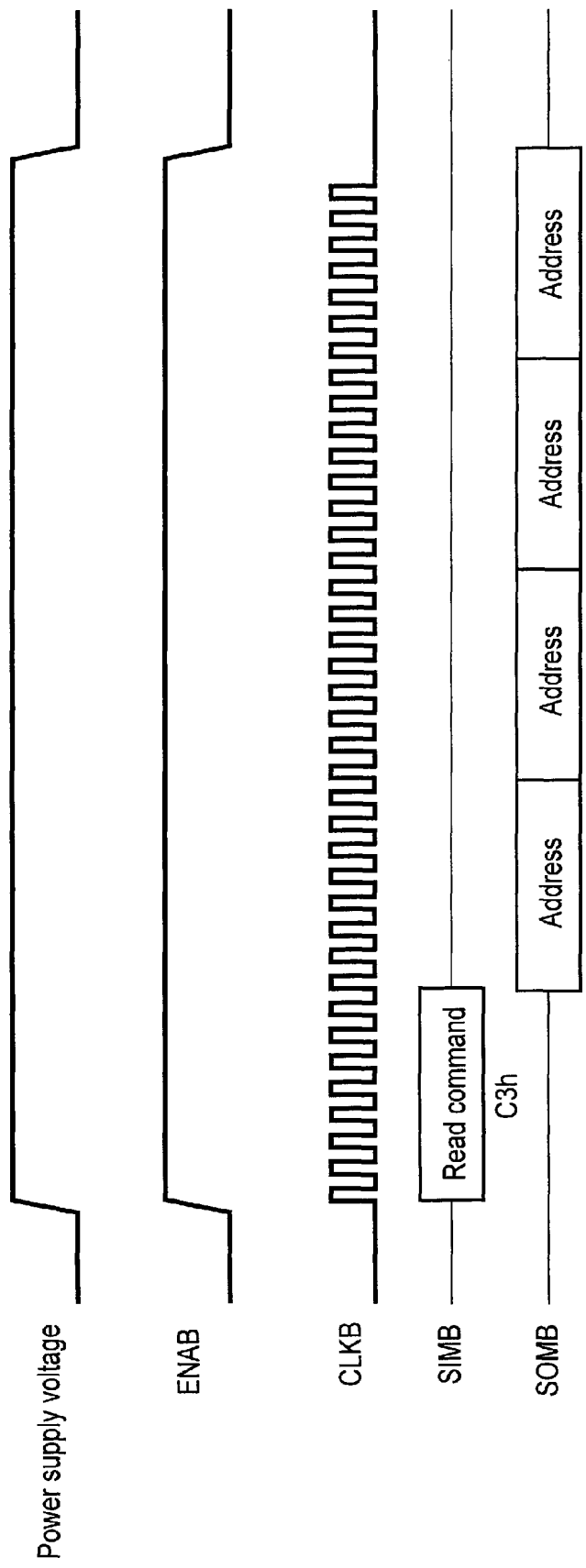
F I G. 29

$$\begin{pmatrix} 1\,0\,0\,0\,1\,0\,1\,1 \\ 1\,1\,0\,0\,0\,1\,0\,1 \\ 1\,1\,1\,0\,0\,0\,1\,0 \\ 0\,1\,1\,1\,0\,0\,0\,1 \\ 1\,0\,1\,1\,1\,0\,0\,0 \\ 0\,1\,0\,1\,1\,1\,0\,0 \\ 0\,0\,1\,0\,1\,1\,1\,0 \\ 0\,0\,0\,1\,0\,1\,1\,1 \end{pmatrix}$$

FIG. 30

$$\begin{pmatrix} P0 \\ P1 \\ P2 \\ P3 \\ P4 \\ P5 \\ P6 \\ P7 \end{pmatrix} = \begin{pmatrix} 1\,0\,0\,0\,1\,0\,1\,1 \\ 1\,1\,0\,0\,0\,1\,0\,1 \\ 1\,1\,1\,0\,0\,0\,1\,0 \\ 0\,1\,1\,1\,0\,0\,0\,1 \\ 1\,0\,1\,1\,1\,0\,0\,0 \\ 0\,1\,0\,1\,1\,1\,0\,0 \\ 0\,0\,1\,0\,1\,1\,1\,0 \\ 0\,0\,0\,1\,0\,1\,1\,1 \end{pmatrix} \begin{pmatrix} D0 \\ D1 \\ D2 \\ D3 \\ D4 \\ D5 \\ D6 \\ D7 \end{pmatrix}$$

FIG. 31

$$\begin{pmatrix} 1\,0\,0\,0\,1\,0\,1\,1 & 1\,0\,0\,0\,0\,0\,0\,0 \\ 1\,1\,0\,0\,0\,1\,0\,1 & 0\,1\,0\,0\,0\,0\,0\,0 \\ 1\,1\,1\,0\,0\,0\,1\,0 & 0\,0\,1\,0\,0\,0\,0\,0 \\ 0\,1\,1\,1\,0\,0\,0\,1 & 0\,0\,0\,1\,0\,0\,0\,0 \\ 1\,0\,1\,1\,1\,0\,0\,0 & 0\,0\,0\,0\,1\,0\,0\,0 \\ 0\,1\,0\,1\,1\,1\,0\,0 & 0\,0\,0\,0\,0\,1\,0\,0 \\ 0\,0\,1\,0\,1\,1\,1\,0 & 0\,0\,0\,0\,0\,0\,1\,0 \\ 0\,0\,0\,1\,0\,1\,1\,1 & 0\,0\,0\,0\,0\,0\,0\,1 \end{pmatrix}$$

↑ First column (corresponding to D0)    ↑ Eighth column (corresponding to D7)    ↑ Ninth column (corresponding to P0)    ↑ Sixteenth column (corresponding to P7)

F I G. 32

$$\begin{pmatrix} S0 \\ S1 \\ S2 \\ S3 \\ S4 \\ S5 \\ S6 \\ S7 \end{pmatrix} = \begin{pmatrix} 1\,0\,0\,0\,1\,0\,1\,1 & 1\,0\,0\,0\,0\,0\,0\,0 \\ 1\,1\,0\,0\,0\,1\,0\,1 & 0\,1\,0\,0\,0\,0\,0\,0 \\ 1\,1\,1\,0\,0\,0\,1\,0 & 0\,0\,1\,0\,0\,0\,0\,0 \\ 0\,1\,1\,1\,0\,0\,0\,1 & 0\,0\,0\,1\,0\,0\,0\,0 \\ 1\,0\,1\,1\,1\,0\,0\,0 & 0\,0\,0\,0\,1\,0\,0\,0 \\ 0\,1\,0\,1\,1\,1\,0\,0 & 0\,0\,0\,0\,0\,1\,0\,0 \\ 0\,0\,1\,0\,1\,1\,1\,0 & 0\,0\,0\,0\,0\,0\,1\,0 \\ 0\,0\,0\,1\,0\,1\,1\,1 & 0\,0\,0\,0\,0\,0\,0\,1 \end{pmatrix} \begin{pmatrix} D0 \\ D1 \\ D2 \\ D3 \\ D4 \\ D5 \\ D6 \\ D7 \\ P0 \\ P1 \\ P2 \\ P3 \\ P4 \\ P5 \\ P6 \\ P7 \end{pmatrix}$$

F I G. 33

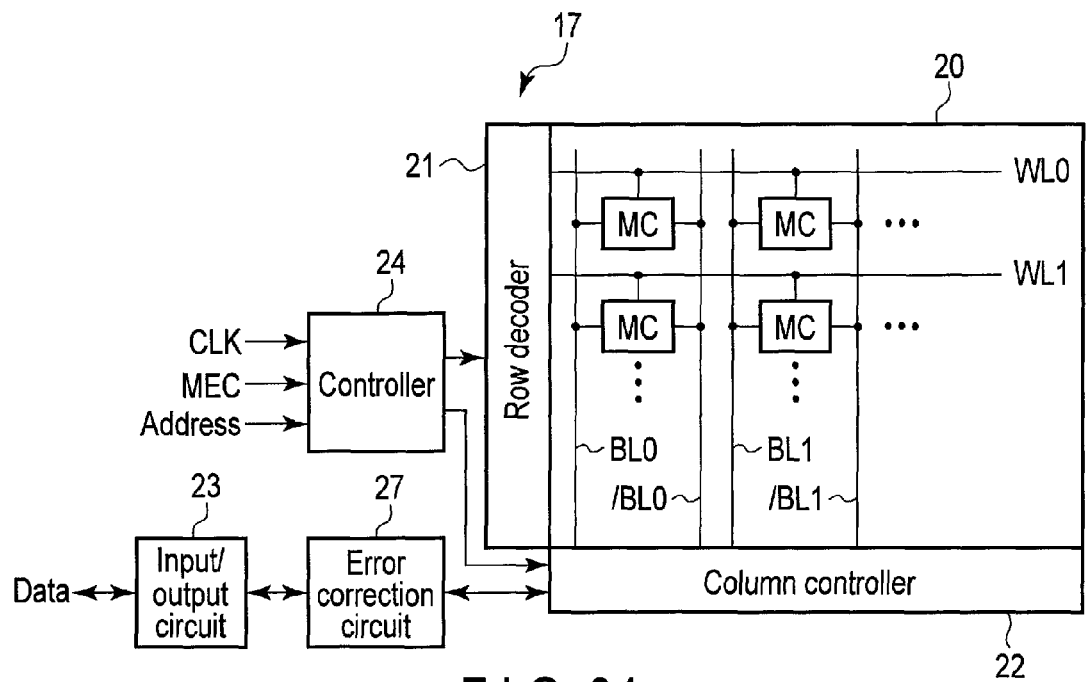
F I G. 34
$$\begin{pmatrix} 1 & 0 & 0 & 0 & 1 & 1 & 1 & 0 \\ 0 & 1 & 0 & 0 & 0 & 1 & 1 & 1 \\ 1 & 0 & 1 & 0 & 0 & 0 & 1 & 1 \\ 1 & 1 & 0 & 1 & 0 & 0 & 0 & 1 \\ 1 & 1 & 1 & 0 & 1 & 0 & 0 & 0 \\ 0 & 1 & 1 & 1 & 0 & 1 & 0 & 0 \\ 0 & 0 & 1 & 1 & 1 & 0 & 1 & 0 \\ 0 & 0 & 0 & 1 & 1 & 1 & 0 & 1 \end{pmatrix}$$
F I G. 35
$$\begin{pmatrix} 1 & 0 & 0 & 1 & 0 & 1 & 0 & 1 \\ 1 & 1 & 0 & 0 & 1 & 0 & 1 & 0 \\ 0 & 1 & 1 & 0 & 0 & 1 & 0 & 1 \\ 1 & 0 & 1 & 1 & 0 & 0 & 1 & 0 \\ 0 & 1 & 0 & 1 & 1 & 0 & 0 & 1 \\ 1 & 0 & 1 & 0 & 1 & 1 & 0 & 0 \\ 0 & 1 & 0 & 1 & 0 & 1 & 1 & 0 \\ 0 & 0 & 1 & 0 & 1 & 0 & 1 & 1 \end{pmatrix}$$
F I G. 36

$$\begin{bmatrix} 1 & 0 & 0 & 1 & 1 & 0 & 1 & 0 \\ 0 & 1 & 0 & 0 & 1 & 1 & 0 & 1 \\ 1 & 0 & 1 & 0 & 0 & 1 & 1 & 0 \\ 0 & 1 & 0 & 1 & 0 & 0 & 1 & 1 \\ 1 & 0 & 1 & 0 & 1 & 0 & 0 & 1 \\ 1 & 1 & 0 & 1 & 0 & 1 & 0 & 0 \\ 0 & 1 & 1 & 0 & 1 & 0 & 1 & 0 \\ 0 & 0 & 1 & 1 & 0 & 1 & 0 & 1 \end{bmatrix}$$

FIG. 37

$$\begin{bmatrix} 1 & 1 & 1 & 0 & 0 & 1 & 1 & 1 \\ 1 & 1 & 0 & 1 & 1 & 1 & 1 & 0 \\ 1 & 0 & 1 & 0 & 1 & 0 & 0 & 1 \\ 1 & 0 & 0 & 1 & 0 & 1 & 1 & 1 \\ 0 & 1 & 1 & 0 & 1 & 0 & 1 & 0 \\ 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{bmatrix}$$

FIG. 38

$$\begin{bmatrix} 1 & 1 & 1 & 0 & 0 & 0 & 0 & 1 \\ 1 & 1 & 0 & 1 & 1 & 0 & 0 & 0 \\ 1 & 0 & 1 & 0 & 1 & 1 & 0 & 0 \\ 1 & 0 & 0 & 1 & 0 & 1 & 1 & 0 \\ 0 & 1 & 1 & 0 & 1 & 0 & 1 & 0 \\ 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{bmatrix}$$

FIG. 39

MEMORY DEVICE AND MEMORY SYSTEM WITH SENSOR

CROSS-REFERENCE TO RELATED APPLICATIONS

This is a Divisional application of U.S. patent application Ser. No. 14/460,021, filed Aug. 14, 2014, which is a Continuation-in-part application of U.S. patent application Ser. No. 14/198,398, filed Mar. 5, 2014, which claims the benefit of U.S. Provisional Application No. 61/869,293, filed Aug. 23, 2013, the entire contents all of which are incorporated herein by reference.

FIELD

Embodiments described herein relate generally to a memory device and a memory system with a sensor.

BACKGROUND

An MRAM (Magnetic Random Access Memory) is known as a nonvolatile semiconductor memory.

BRIEF DESCRIPTION OF THE DRAWINGS

FIG. 1 is a block diagram of a memory system according to a first embodiment;

FIG. 2 is a block diagram of an MRAM;

FIG. 3 is a circuit diagram of one memory cell;

FIG. 4 is a block diagram of an address memory and address memory controller;

FIG. 5 is a diagram showing one example of a Gray code;

FIG. 6 is a timing chart showing signals supplied to a memory device;

FIG. 8 is a block diagram of an address memory and address memory controller according to a third embodiment;

FIG. 9 is a diagram showing the relationship between an input and output of an MSB extractor obtained when an address is formed of four bits;

FIG. 12 is a diagram showing the relationship between an input and output of an MSB extractor obtained when an address is formed of four bits;

FIG. 14 is a circuit diagram showing another example of the MSB extractor;

FIG. 15 is a block diagram of an address memory and address memory controller according to a modification;

FIG. 16 is a block diagram of an address memory and address memory controller according to a fifth embodiment;

FIG. 20 illustrates an example of a flow of a signal on signal line SI in accordance with a serial transmission interface;

FIG. 24 illustrates a second example of signals transmitted and received between a module controller and an address memory controller in the seventh embodiment;

FIG. 25 is a block diagram of a memory system according to an eighth embodiment;

FIG. 27 illustrates signals transmitted and received between a module controller and an address memory controller in a second example of the eighth embodiment;

FIG. 29 illustrates signals transmitted and received between a module controller and the second address memory controller in a second example of the ninth embodiment;

FIG. 30 illustrates an example of a parity generation matrix according to a tenth embodiment;

FIG. 31 illustrates an example of an operation to generate parity according to the tenth embodiment FIG. 32 illustrates an example of a decryption matrix according to the tenth embodiment FIG. 33 illustrates an operation for error correction with the decryption matrix of FIG. 32;

FIG. 34 is a block diagram of a nonvolatile memory according to the tenth embodiment;

FIG. 35 illustrates a second example of a parity generation matrix according to the tenth embodiment;

FIG. 36 illustrates a third example of a parity generation matrix according to the tenth embodiment;

FIG. 37 illustrates a fourth example of a parity generation matrix according to the tenth embodiment;

FIG. 38 illustrates a fifth example of a parity generation matrix according to the tenth embodiment; and FIG. 39 illustrates a sixth example of a parity generation matrix according to the tenth embodiment.

DETAILED DESCRIPTION

Figure 7:
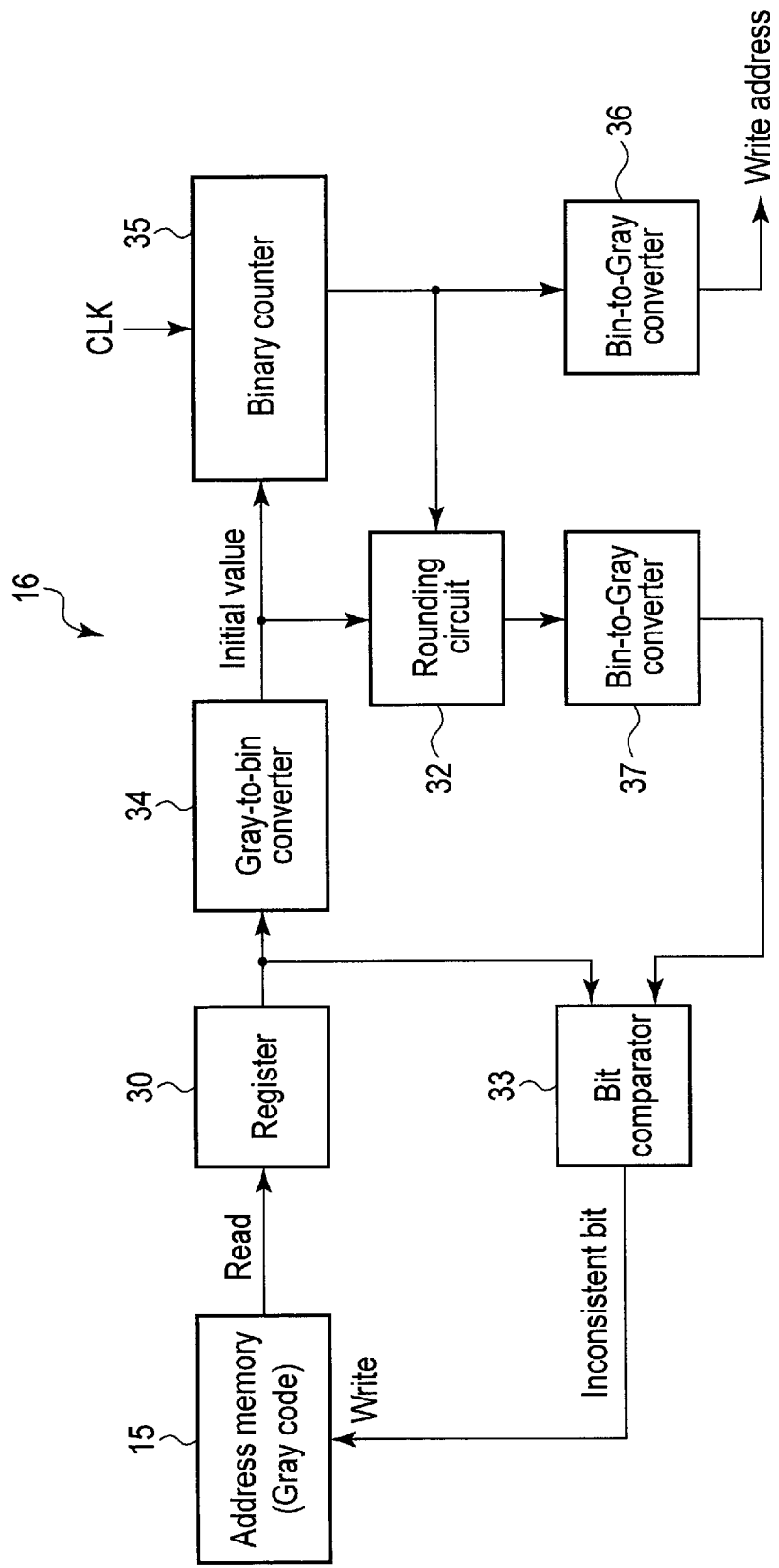
FIG. 7 is a block diagram of an address memory and an address memory controller according to a second embodiment.

According to one embodiment, a memory device comprises a first address memory storing a first address; a controller which is based on a first interface which transmits a signal serially and outputs a first command in accordance with the first interface; and a memory which stores data in a nonvolatile manner, is based on the first interface, and stores received write data in an address based on the first address when the memory receives the first command.

With the recent development of computer networks and miniaturization of communication devices and measurement units, a system such as machine to machine (M2M) in which information items are mutually exchanged between multiple devices without human operations to automatically optimize the operation control, is proposed. In such a system, information items of various devices are transferred via the network. One example of the device is a sensor device, in which information items such as temperatures, vibrations, brightness, acceleration or angles are measured by means of various sensors and the measurement data are transmitted to the network. The operation power supply of the sensor device is obtained by use of a battery or energy harvester, except for a case wherein a stable power supply voltage is applied. Therefore, lowering the power consumption of components contained in the sensor device becomes more important in the field of M2M and sensor device networks. A memory used for storing measurement data is also one of the components of the device and, in the embodiments, it is assumed that a nonvolatile memory is used, the technique related to lowering the power consumption is addressed.

In a nonvolatile memory having a mode in which the write process is successively performed to store the measurement results of the sensor, it is necessary to interrupt supply of power to the nonvolatile memory to reduce a consumed current after completion of the write process. In this case, the nonvolatile memory itself should record an internal address used to continue the write process after the power supply is turned on next time. The object of this embodiment is to suppress the power consumption of the nonvolatile memory by reducing the number of to-be-rewritten bits of the nonvolatile memory as far as possible. In order to realize this, in the embodiments, the internal address is formed by a Gray code and a circuit for controlling the internal address used for starting the write process to be rewritten only to a value obtained by increasing the previously stored address by a power of two is provided. As a result, the number of to-be-rewritten bits in the nonvolatile memory for address recording is 20 bits at maximum in the conventional technique since, for example, an address identifying a space of one megabit is expressed by 1M=1048576=2 to the power of twenty, but the number of to-be-rewritten bits is suppressed to two bits at maximum by applying the technique of the embodiments. As a result, the power consumption of the nonvolatile memory can be suppressed.

Embodiments of this invention are now described with reference to the accompanying drawings. In the following explanation, components having the same functions and configurations are denoted by the same symbols and a repetitive explanation is made only when required. The entire description for a particular embodiment is also applicable to another embodiment unless it is explicitly mentioned otherwise or obviously denied.

First Embodiment

[1. Whole Configuration]

FIG. 1 is a block diagram of a memory system 10 according to a first embodiment. The memory system 10 includes a power supply circuit 11, module controller 12, sensor 13 and memory device 14. The memory device 14 includes an address memory 15, address memory controller 16 and nonvolatile memory 17.

The sensor 13 makes measurements and transmits measurement data as write data to the nonvolatile memory 17. The write data are in a digital form. In contrast, the measurement data generated by the sensor 13 may be in an analog format. In such a case, analogue measurement data are converted into digital write data by an analog to digital (AD) converter. Although not illustrated by FIG. 1, an AD converter is located between the output of the sensor 13 and the nonvolatile memory 17. A write address used for storing measurement data in the nonvolatile memory is generated by means of the address memory 15 and address memory controller 16.

The module controller 12 controls the whole operation of the memory system 10. The module controller 12 transmits measurement control signal MSC to the sensor 13 to control the measurement operation of the sensor 13 by use of measurement control signal MSC. The module controller 12 transmits a write clock CLK and an enable signal ENA to the address memory controller 16. Further, the module controller 12 transmits the write clock CLK and memory control signal MEC to the nonvolatile memory 17 to control the operation of the nonvolatile memory 17 (for example, write operation) by use of the memory control signal MEC.

The module controller 12 may include a sequencer, for example. The sequencer is responsible for, among the functions of the module controller 12, functions in accordance with predefined procedures.

For example, the sequencer generates the measurement control signal MSC, the enable signal ENA and the memory control signal MEC. Moreover, the sequencer may also include a function for managing a schedule. Specifically, in one embodiment of operation, the sequencer is activated periodically based on, for example, a timer or when a particular event occurs. When activated, the sequencer in turn activates the sensor 13 and the memory device 14 through the start of the power supply from the power supply circuit 11, and executes measurement and storing of data. Alternatively, in another embodiment of operation, the sequencer may activate the memory device 14 to store data when the measurement data exhibits a sign of a change. Some of the functions of the sequencer may be implemented by a microcomputer.

The power supply circuit 11 generates and supplies various power supply voltages to the module controller 12, sensor 13 and memory device 14. As the power supply circuit 11, for example, a battery, solar battery or energy harvest could be used. The memory system 10 may be configured to be supplied with external power supply voltages.

The address memory 15 is configured by use of a nonvolatile memory and stores address information in a nonvolatile fashion. Address information stored by means of the address memory 15 is the initial address generated when the previous write access is made to the nonvolatile memory 17. The address memory controller 16 reads address information (initial value) from the address memory 15. Then, the address memory controller 16 generates a write address by use of the address information and transmits the write address to the nonvolatile memory 17. Write access is made to the nonvolatile memory 17 by use of the write address. The address memory 15 may be implemented by some of the functions of the nonvolatile memory 17.

For example, the memory system 10 could be configured by use of one semiconductor chip. Alternatively, the memory system 10 may be configured by a plurality of modules, each module being configured by a semiconductor chip and connected on a system board. Further, the memory system 10 may be configured as a multi-chip module in one package. Alternatively, the nonvolatile memory 17, address memory 15 and address memory controller 16 could be designed and manufactured as one semiconductor chip. In FIG. 1, a method for reading data stored in the nonvolatile memory 17 and outputting the data to the exterior of the memory system 10 is not clearly described, but a circuit having such a function can be additionally provided.

Figure 17:
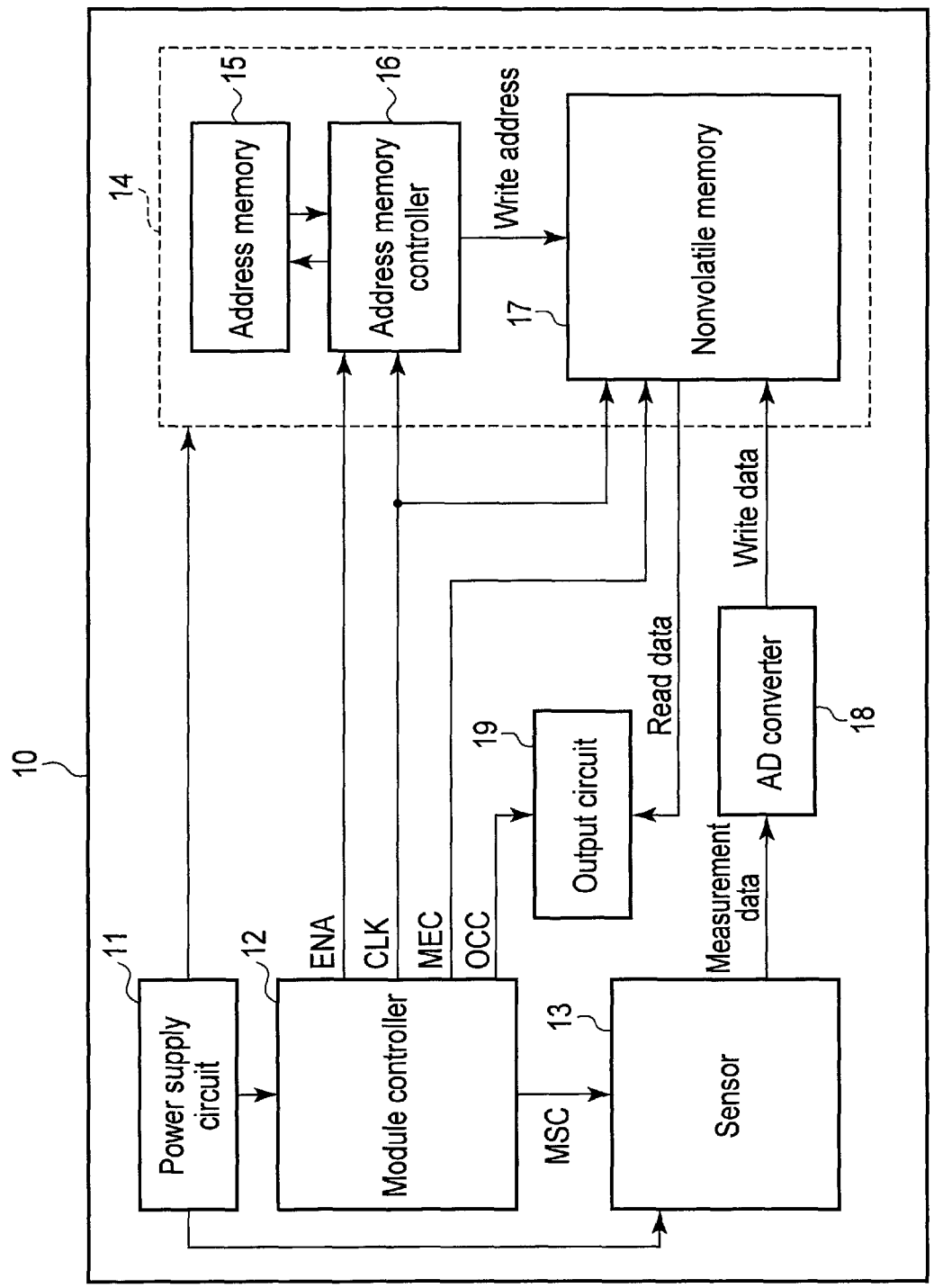
FIG. 17 is a block diagram of another example of the memory system according to the first embodiment.

FIG. 17 is a block diagram of another example of the memory system 10 according to the first embodiment. FIG. 17 also illustrates an AD converter 18, which is omitted in FIG. 1. The AD converter 18 receives the analogue measurement data from the sensor 13, and outputs the digital measurement data as the write data. The memory system 10 further includes an output circuit 19. In accordance with an instruction OCC from the module controller 12, the output circuit 19 receives data from the nonvolatile memory 17, and outputs the received data to outside the memory system 10. The data output to outside the memory system 10 is executed wirelessly, for example. For that purpose, the output circuit 19 includes a wireless communication module. The wireless communication module follows instructions by the module controller 12 to add the received data to a radio signal to transmit it outside the memory system 10. The module controller 12 follows instructions from, for example, outside, to read data in the nonvolatile memory 17 in order to output it outside the memory system 10. Alternatively, the module controller 12 starts the output of data in the nonvolatile memory 17 to outside the memory system 10 at a particular timing.

The measurement by the sensor 13 and writes to the nonvolatile memory 17 of measurement data (or, write data) may be executed at a low frequency. In such a case, parallel execution of measurement, data writes and data transmissions by the output circuit 19 at a low frequency may be inefficient, and therefore may consume much power. To address this, the module controller 12 executes low-frequency measurements and data writes without outputting such to the outside in succession while remaining ON, and collects data up to a particular quantity before transmitting it en bloc outside the memory system 10 using the output circuit 19, for example.

The memory system 10 may be used for an application in which it observes and measures small-size data items one after another, and stores them, for example. For example, the memory system 10 may be normally powered OFF, and be used in an application in which it is turned on sporadically to store relatively-small-size data items one after another at a low frequency, and outputs accumulated data outside at a particular timing.

[2. Configuration of Nonvolatile Memory 17]

Next, a configuration example of the nonvolatile memory 17 is described. As the nonvolatile memory 17, various types of semiconductor memories such as an MRAM (Magnetic Random Access Memory), ReRAM (Resistance Random Access Memory), PCRAM (Phase-Change Random Access Memory) and flash memory (for example, NAND flash memory) can be used. In the present embodiment, one example in which an MRAM is used as the nonvolatile memory 17 is described.

FIG. 2 is a block diagram of the MRAM 17. The MRAM 17 includes a memory cell array 20, row decoder 21, column controller 22, input/output circuit 23 and controller 24.

The memory cell array 20 is configured by use of memory cells MC arranged in a matrix form. In the memory cell array 20, bit line pairs BL, /BL and word lines WL are arranged.

FIG. 3 is a circuit diagram of one memory cell MC. Memory cell MC includes a magnetoresistive effect element (MTJ (Magnetic Tunnel Junction) element) 25 and select transistor 26. As the select transistor 26, for example, an n-channel MOSFET is used. One end of the MTJ element 25 is connected to a bit line BL and the other end thereof is connected to the drain of the select transistor 26. The gate of the select transistor 26 is connected to a word line WL and the source thereof is connected to a bit line /BL.

The row decoder 21 is connected to the word lines WL. The row decoder 21 selects one of the word lines WL based on a row address.

The column controller 22 is connected to the bit line pairs BL, /BL. In the data write mode, the column controller 22 selects one of the bit line pairs based on a column address and passes a write current through a selected memory cell via the selected bit line pair to write data in the selected memory cell. Further, in the data read mode, the column controller 22 selects one of the bit line pairs based on a column address to read data from the selected bit line pair. In order to perform the above operation, the column controller 22 is configured to include a column decoder, a column selector, sense amplifiers, a write driver and the like.

The input/output circuit 23 transmits write data input from the exterior to the column controller 22 and outputs read data input from the column controller 22 as output data to the exterior.

The controller 24 performs overall control of the various operations of the MRAM 17. For example, the controller 24 receives an address, write clock CLK and memory control signal MEC from the exterior and controls the write operation and read operation based on the above signals.

[3. Configuration of Address Memory 15 and Address Memory Controller 16]

The configuration of the address memory 15 and address memory controller 16 is now described in more detail. FIG. 4 is a block diagram of the address memory 15 and address memory controller 16. The address memory controller 16 corresponds to the components other than the address memory 15 among the components of FIG. 4. That is, the address memory controller 16 includes a register 30, Gray code counter 31, rounding circuit 32 and bit comparator 33.

In the present embodiment, address information stored in the address memory 15 is described with a Gray code. FIG. 5 is a diagram showing one example of a Gray code. The Gray codes are codes in which the number of bits that vary between adjacent codes is always one. In FIG. 5, the relationship between binary codes, decimal codes and Gray codes is shown.

The register 30 temporarily stores address information read from the address memory 15. The Gray code counter 31 counts up address information (Gray code) stored in the register 30 each time write clock CLK is input.

The rounding circuit 32 rounds the final output of the Gray code counter 31 to set the number of bits to be rewritten in the address information read from the address memory 15 to two bits at maximum. Specifically, the rounding circuit 32 outputs a value that is equal to or larger than the final output of the Gray counter 31 and larger than the output of the register 30 (initial value of the Gray code counter 31) by one or a power of two, for example, 2, 4, 8, . . . .

The bit comparator 33 compares the output of the rounding circuit 32 with the output of the register 30 for each bit. Then, the bit comparator 33 transmits only bits that are inconsistent with the original value to the address memory 15.

[4. Operation]

The operation of the memory system 10 with configuration described above is now described. FIG. 6 is a timing chart showing signals supplied to the memory device 14.

When the power supply of the memory system 10 is turned on, the module controller 12 asserts the enable signal ENA. Then, the module controller 12 generates the write clock CLK which is in response to write accesses and transmits write data from the sensor 13 to the nonvolatile memory 17 in synchronism with the write clock CLK.

Further, the address memory controller 16 supplies a write address to the nonvolatile memory 17 in synchronism with write clock CLK. Specifically, when the enable signal ENA is asserted, the address memory controller 16 reads address information from the address memory 15 and counts up the write address each time the write clock CLK is input where the address information is used as an initial value. The nonvolatile memory 17 stores write data in the memory cell of the write address.

When a series of write accesses is completed, the module controller 12 negates the enable signal ENA. Once the enable signal ENA is negated, the address memory controller 16 writes address information in the address memory 15. The address information written in the address memory 15 here is the final address used in the series of write accesses and will be read, and becomes an initial value when the enable signal ENA is next asserted. After this, the module controller 12 interrupts supply of the power from the power supply circuit 11.

In the present embodiment, the enable signal ENA is supplied from the exterior of the memory device 14. However, the memory device 14 may include a circuit that detects the level of the power supply, for example, and the memory device 14 may be configured to assert the enable signal ENA when the power supply voltage becomes equal to or higher than a preset first potential and negate the enable signal ENA when the power supply voltage becomes equal to or lower than a preset second potential. For stable operation of the circuit, it is desirable to set the second potential lower than the first potential.

Next, a more detailed operation of the address memory controller 16 is described with reference to FIG. 4. When the enable signal ENA is asserted, the address information is read from the address memory 15 and is temporarily stored in the register 30. The address information stored in the register 30 is used as an initial value of the Gray code counter 31.

The module controller 12 activates the write clock CLK upon each write access to the nonvolatile memory 17. The Gray code counter 31 counts up the address from the initial value according to the Gray code rule for each pulse of the write clock CLK. For a write access to the nonvolatile memory 17, an output of the Gray code counter 31 is used as a write address. That is, write accesses are made to the nonvolatile memory 17 sequentially from an address next to the address stored in the address memory 15 after the memory system 10 is started. There are several known circuits as the Gray code counter 31 of the present embodiment and therefore a detailed description thereof is omitted here.

When a series of write accesses is completed, the enable signal ENA is negated and the rounding circuit 32 outputs a value that is the equal to or larger than the final output of the Gray code counter 31 and larger than the output of the register 30 (initial value of Gray code counter 31) by one or a power of two, for example, 2, 4, 8, . . . .

The bit comparator 33 compares the output of the rounding circuit 32 with the output of the register 30 for each bit. Only bits that are inconsistent as the result of comparison by the comparator 33 are written in the address memory 15. Bits that are consistent are not written and the original values (read data) are maintained. Due to the characteristic of the Gray code, the number of to-be-rewritten bits is two at maximum when the address is changed by a power of two.

[5. Effect]

As a comparison example, if address information stored in the address memory 15 is not formed of a Gray code but formed of a binary code and a binary counter is used instead of the Gray code counter 31, for example, it is necessary to rewrite four bits when a 4-bit address is changed by one from "0111" to "1000". For example, since an address is 20 bits in a memory being accessed by use of addresses of 1 megabit, there is a possibility that 20 bits may be rewritten at maximum.

On the other hand, in the present embodiment, when address information stored in the address memory 15 is rewritten after a series of write accesses (all of the write accesses from the time when the enable signal ENA is asserted until the signal is negated) is completed, the number of to-be-rewritten bits is suppressed to two at maximum. As a result, the power consumption required for rewriting address information stored in the address memory 15 can be greatly reduced.

Further, write access is made to the nonvolatile memory 17 by use of a write address formed of a Gray code that is the output of the Gray code counter 31. Therefore, since a change in an address for each write access can be suppressed to one bit, the number of address lines which are charged and discharged can be reduced and, as a result, the power consumption can be reduced.

Data is not written in a storage region corresponding to an address skipped by rounding circuit 32 in the storage region of the nonvolatile memory 17. For example, the unwritten region may be managed by writing an invalid flag in the unwritten region.

Second Embodiment

A second embodiment is an embodiment in which a counter that counts up an address is configured by a binary counter, which can be easily realized. FIG. 7 is a block diagram of an address memory 15 and address memory controller 16 according to the second embodiment. The address memory controller 16 includes a register 30, rounding circuit 32, bit comparator 33, Gray-to-bin converter 34, binary counter 35 and bin-to-Gray converters 36, 37.

The Gray-to-bin converter 34 converts address information formed of a Gray code to a binary code. The binary counter 35 counts up address information converted to a binary code by the Gray-to-bin converter 34 each time the write clock CLK is input. The bin-to-Gray converters 36, 37 each convert address information formed of a binary code to a Gray code.

In order to convert a Gray code to a binary, the exclusive OR (XOR) of a bit and all of the more significant bits than that bit is calculated. For example, the following operations are performed to convert a 4-bit Gray code address G3, G2, G1, G0 to binary B3, B2, B1, B0.

B3=G3
B2=G3 XOR G2
B1=G3 XOR G2 XOR G1
B0=G3 XOR G2 XOR G1 XOR G0

In order to convert a binary to a Gray code, the exclusive OR of a bit and a bit that is one-bit more significant than that bit is calculated. For example, the following operations are performed to convert 4-bit binary B3, B2, B1, B0 to a Gray code address G3, G2, G1, G0.

G3=B3
G2=B3 XOR B2
G1=B2 XOR B1
G0=B1 XOR B0

The exclusive OR operation is known in the art and therefore a detailed explanation thereof is omitted here.

The operation of the address memory controller 16 with the above configuration is now described. Address information stored in the register 30 is supplied to the Gray-to-bin converter 34. The Gray-to-bin converter 34 converts address information formed of a Gray code to a binary according to the table of FIG. 5. Address information converted to a binary by the Gray-to-bin converter 34 is used as an initial value of the binary counter 35.

The module controller 12 activates the write clock CLK each time write access is made to the nonvolatile memory 17. The binary counter 35 counts up the address from the initial value for each pulse of the write clock CLK.

The bin-to-Gray converter 36 converts a count of the binary counter 35 to a Gray code according to the table of FIG. 5. For write access to the nonvolatile memory 17, a Gray code converted by the bin-to-Gray converter 36 is used as a write address.

When a series of write accesses is completed, the enable signal ENA is negated and the rounding circuit 32 outputs a value that is equal to or larger than the final output of the binary counter 35 and larger than the output of the Gray-to-bin converter 34 (initial value) by one or a power of two, for example, 2, 4, 8, . . . . The bin-to-Gray converter 37 converts an output of the rounding circuit 32 formed of a binary to a Gray code.

The bit comparator 33 compares the output of the bin-to-Gray converter 37 with the output of the register 30 for each bit. Only bits that are inconsistent as the result of comparison by the bit comparator 33 are written in the address memory 15. Bits that are consistent are not written and the original values (read data) are maintained. Due to the characteristic of the Gray code, the number of to-be-rewritten bits is two at maximum when the address is changed by a power of two. As a result, the same effect as that of the first embodiment can be obtained.

Further, a binary is converted to a Gray code by the bin-to-Gray converter 36 and write access is made to the nonvolatile memory 17 by use of a write address formed of the Gray code. Therefore, since a change in an address for each write access can be suppressed to one bit, the number of address lines which are charged and discharged can be reduced and, as a result, the power consumption can be reduced. The count of the binary counter 35 can be used as a write address. That is, the bin-to-Gray converter 36 can be omitted and write access is made to the nonvolatile memory 17 by use of a write address formed of a binary.

Third Embodiment

A third embodiment shows a concrete configuration example of a rounding circuit 32. FIG. 8 is a block diagram of an address memory 15 and address memory controller 16 according to the third embodiment.

A binary counter 38 whose initial value is "0" is newly provided in parallel with the binary counter 35 that uses a value read from the address memory 15 and is supplied via the Gray-to-bin converter 34 as an initial value. The binary counter 38 counts up an address from an initial value=0 in response to the write clock CLK generated for each write access. An output of the binary counter 35 is used as a write address.

The rounding circuit 32 includes an MSB (most significant bit) extractor 32A and adder 32B. After a series of write accesses is completed (the enable signal ENA is negated), the MSB extractor 32A (1) outputs the final output of the binary counter 38 as it is when the final output is one or a power of two and (2) outputs a value that is larger than the final output of the binary counter 38 and is a power of two when the final output is neither one nor a power of two. More specifically, first, the MSB extractor 32A extracts the MSB of the final output of the binary counter 38. Then, the MSB extractor 32A outputs the final output of the binary counter 38 as it is when the final output is 1. Further, a binary that is a power of two has 1 in only one bit and 0 in the other bits. Therefore, the MSB extractor 32A outputs the final output of the binary counter 38 as it is when the final output of the binary counter 38 has only one bit of 1 and outputs a value that is a power of two in which only the more significant bit next to the MSB is 1 when the final output of the binary counter 38 has plural bits of 1.

FIG. 9 is a diagram showing the relationship between an input and output of the MSB extractor 32A obtained when an address is formed of four bits. The MSB extractor 32A outputs a value of a power of two as it is when the 4-bit address is a power of two and outputs a value obtained by rounding up the value to a power of two in other cases.

The adder 32B adds an output (initial value) of a Gray-to-bin converter 34 to an output of the MSB extractor 32A. The output of the adder 32B is input to a bit comparator 33 via a bin-to-Gray converter 37. As described before in detail, also, in the third embodiment, the same effect as that of the first embodiment can be obtained.

Fourth Embodiment

Figure 10:
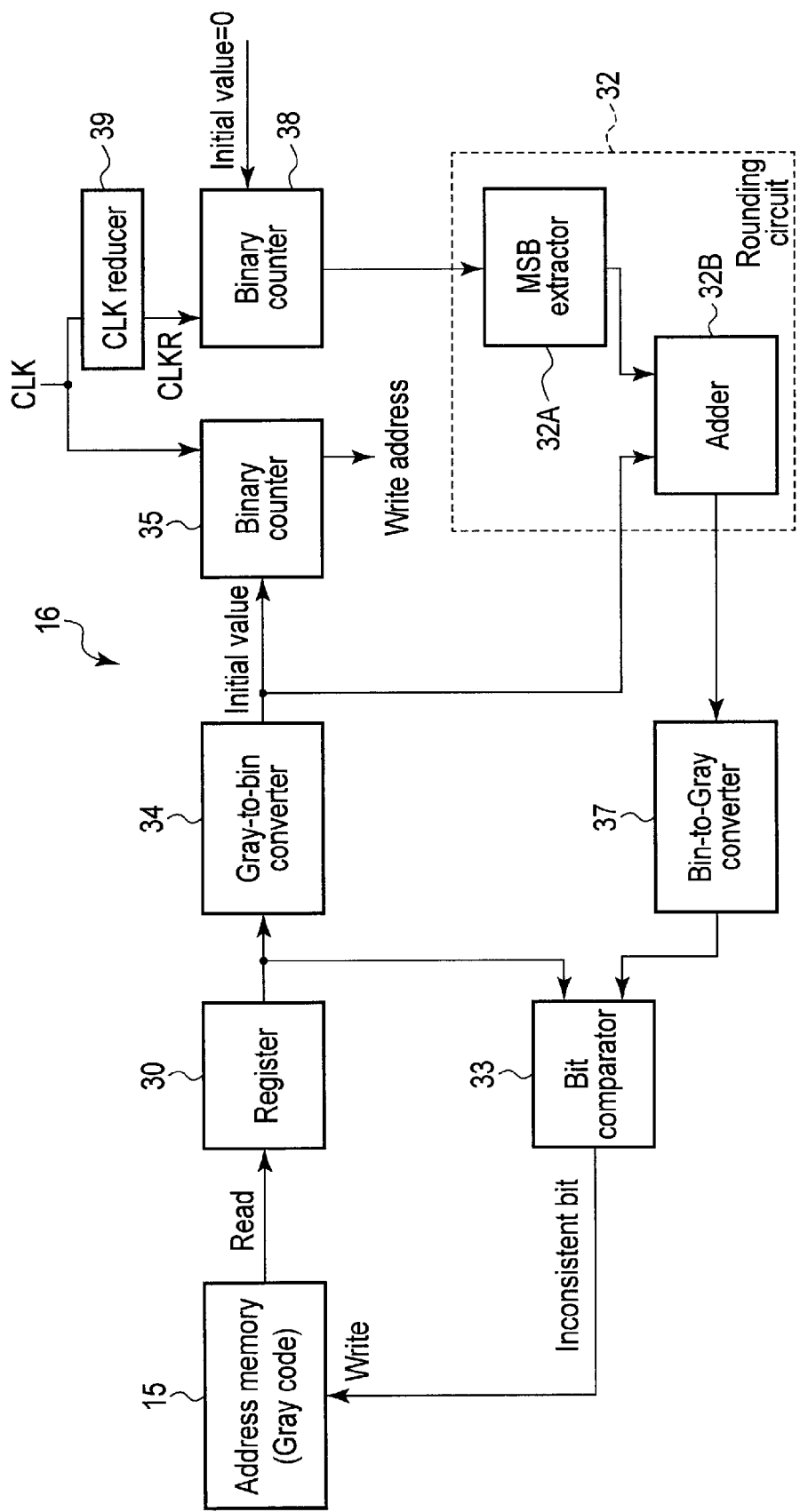
FIG. 10 is a block diagram of an address memory and address memory controller according to a fourth embodiment.

A fourth embodiment shows another configuration example of the rounding circuit 32. FIG. 10 is a block diagram of an address memory 15 and address memory controller 16 according to the fourth embodiment.

Figure 11:
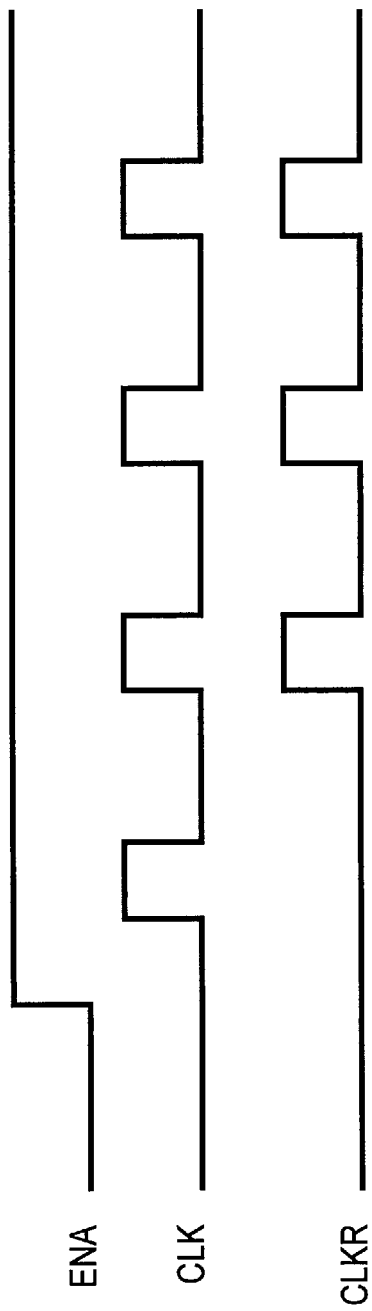
FIG. 11 is a waveform diagram of write clock CLK and clock CLKR.

In the fourth embodiment, the number of pulses of clock CLKR input to a binary counter 38 is less by one than the number of pulses of the write clock CLK generated for each write access. For this control operation, the address memory controller 16 includes a clock reducer (CLK reducer) 39. The clock reducer 39 receives the write clock CLK after the enable signal ENA is asserted and generates the clock CLKR obtained by eliminating the first one pulse of the write clock CLK (shifted by one clock cycle). FIG. 11 is a waveform diagram of write clock CLK and clock CLKR. The function of the clock reducer 39 can be realized by use of a known method using a shift register or the like.

The binary counter 38 is supplied with a clock having one pulse reduced from that of the third embodiment and the MSB extractor 32A outputs a value of a power of two in which only one-bit more significant than the MSB of the final output of the binary counter 38 is 1 (the output value is 1 when the final output of the binary counter 38 is 0). FIG. 12 is a diagram showing the relationship between an input and output of the MSB extractor 32A obtained when an address is formed of four bits.

Figure 13:
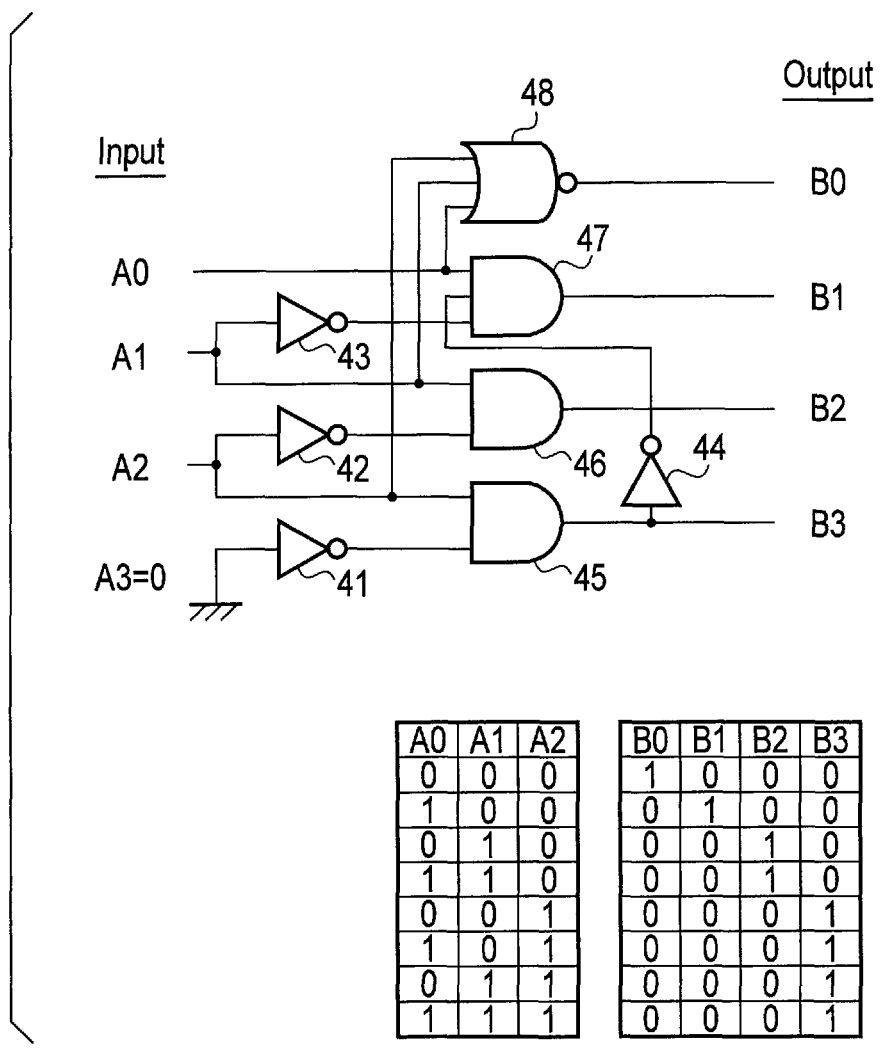
FIG. 13 is a circuit diagram showing one example of the MSB extractor.

The function of the MSB extractor 32A can be relatively easily realized. FIG. 13 is a circuit diagram showing one example of the MSB extractor 32A. Inputs of the MSB extractor 32A are A3, A2, A1, A0 and outputs thereof are B3, B2, B1, B0. In FIG. 13, the correspondence table between inputs A2, A1, A0 and outputs B3, B2, B1, B0 is also shown. Input A3 is fixed at 0.

The MSB extractor 32A includes inverters 41 to 44, AND gates 45 to 47 and NOR gate 48. Input A0 is connected to the inputs of the AND gate 47 and NOR gate 48. Input A1 is connected to the inputs of the inverter 43, AND gate 46 and NOR gate 48. The output of the inverter 43 is connected to the input of the AND gate 47. Input A2 is connected to the inputs of the inverter 42, AND gate 45 and NOR gate 48. The output of the inverter 42 is connected to the input of the AND gate 46. Input A3 is fixed at 0 and is connected to the input of the inverter 41. The output of the inverter 41 is connected to the input of the AND gate 45. The output of the AND gate 45 is connected to the input of the AND gate 47 via the inverter 44. The output of the NOR gate 48 corresponds to output B0, the output of the AND gate 47 corresponds to output B1, the output of the AND gate 46 corresponds to output B2 and the output of the AND gate 45 corresponds to output B3.

FIG. 14 is a circuit diagram showing another example of the MSB extractor 32A. The MSB extractor 32A includes inverters 50, 51 and NOR gates 52 to 54. Input A0 is connected to the inputs of the inverter 51 and NOR gate 54. The output of the inverter 51 is connected to the input of the NOR gate 53. Input A1 is connected to the inputs of the inverter 50 and NOR gates 53, 54. The output of the inverter 50 is connected to the input of the NOR gate 52. Input A2 is connected to the inputs of the NOR gates 52 to 54. The output of the NOR gate 54 corresponds to output B0, the output of the NOR gate 53 corresponds to output B1, the output of the NOR gate 52 corresponds to output B2 and input A2 corresponds to output B3.

In the above description, the first pulse of the write clock CLK is neglected and the remaining pulses are output after the enable signal ENA is asserted according to the function of the clock reducer 39. However, the essence of the present embodiment lies in that the number of pulses of clock CLKR input to the binary counter 38 is different from the number of pulses of the write clock CLK. For example, the same effect can be obtained if the last pulse of the write clock CLK is neglected when the enable signal ENA is negated. Further, the output clock of the clock reducer 39 may not be necessarily output in synchronism with the write clock CLK.

As described above in detail, according to the fourth embodiment, like the first embodiment, when address information stored in the address memory 15 is rewritten after a series of write accesses is completed, the number of to-be-rewritten bits can be two bits at maximum. As a result, the same effect as that of the first embodiment can be obtained in the fourth embodiment.

(Modification)

A write address supplied to the nonvolatile memory 17 can be converted to a Gray code. FIG. 15 is a block diagram of an address memory 15 and address memory controller 16 according to a modification. In FIG. 15, a bin-to-Gray converter 60 is added to the circuit of FIG. 10. The bin-to-Gray converter 60 converts an output of a binary counter 35 to a Gray code. As a result, a write address formed of a Gray code is supplied to the nonvolatile memory 17. According to the modification, since a change in an address for each write access can be suppressed to one bit, the number of address lines used for charging and discharging can be reduced and, as a result, the power consumption can be reduced.

Fifth Embodiment

In the second to fourth embodiments, the binary counter is used for counting up the address, but in the fifth embodiment, a Gray code counter is used for counting up the address and the Gray-to-bin converter and bin-to-Gray converter are omitted.

FIG. 16 is a block diagram of an address memory 15 and address memory controller 16 according to the fifth embodiment. The address memory controller 16 includes two Gray code counters 31, 61. The Gray code counter 31 has the same function as that of the first embodiment. The Gray code counter 61 counts up an address based on the clock CLK from the clock reducer 39. The output of the Gray code counter 61 corresponding to the clock CLKR is as shown in FIG. 5.

A rounding circuit 32 includes an added value extractor 32C and adder 32B. The added value extractor 32C receives the final output of the Gray code counter 61. Then, the added value extractor 32C outputs a value that is equal to or larger than the final output of the Gray code counter 61 and is a power of two.

The adder 32B performs a count-up operation once according to the Gray code rule to add a value of a power of two to the initial value while the position of the least significant bit is adequately changed. Specifically, the adder 32B performs the following operations.

(1) When the final output of the Gray code counter 61 is 0 (when write clock CLK is one pulse), the least significant bit of the initial value is set as the least significant bit and the count-up operation is performed once to the initial value according to the Gray code rule. That is, the counting up is performed only once according to the Gray code rule.

(2) When the final output of the Gray code counter 61 is 1 (when write clock CLK is two pulses), the second bit from the least significant bit of the initial value is set as the least significant bit and the count-up operation is performed once to the initial value according to the Gray code rule and the least significant bit is inverted.

(3) When the added value is "4 (the second power of 2)", the third bit from the least significant bit is set as the least significant bit, the count-up operation is performed once to the initial value according to the Gray code rule, the least significant bit is fixed and the second bit from the least significant bit is inverted.

(4) When the added value is "8 (the third power of 2)", the fourth bit from the least significant bit is set as the least significant bit, the count-up operation is performed once to the initial value according to the Gray code rule, the least significant bit and second bit are fixed and the third bit from the least significant bit is inverted.

A similar idea is applied when the added value is the fourth power or more of 2.

The operation of the other circuits is the same as that of the first embodiment.

As described above in detail, in the fifth embodiment, when address information stored in the address memory 15 is rewritten after a series of write accesses (all of the write accesses while the enable signal ENA remains asserted) is completed, the number of to-be-rewritten bits can be suppressed to two at maximum. Further, a memory system 10 can be realized without using the Gray-to-bin converter and bin-to-Gray converter.

Sixth Embodiment

The sixth embodiment relates to application of a particular interface to the memory system 10, and is applicable to any of the first to fifth embodiments.

Figure 18:
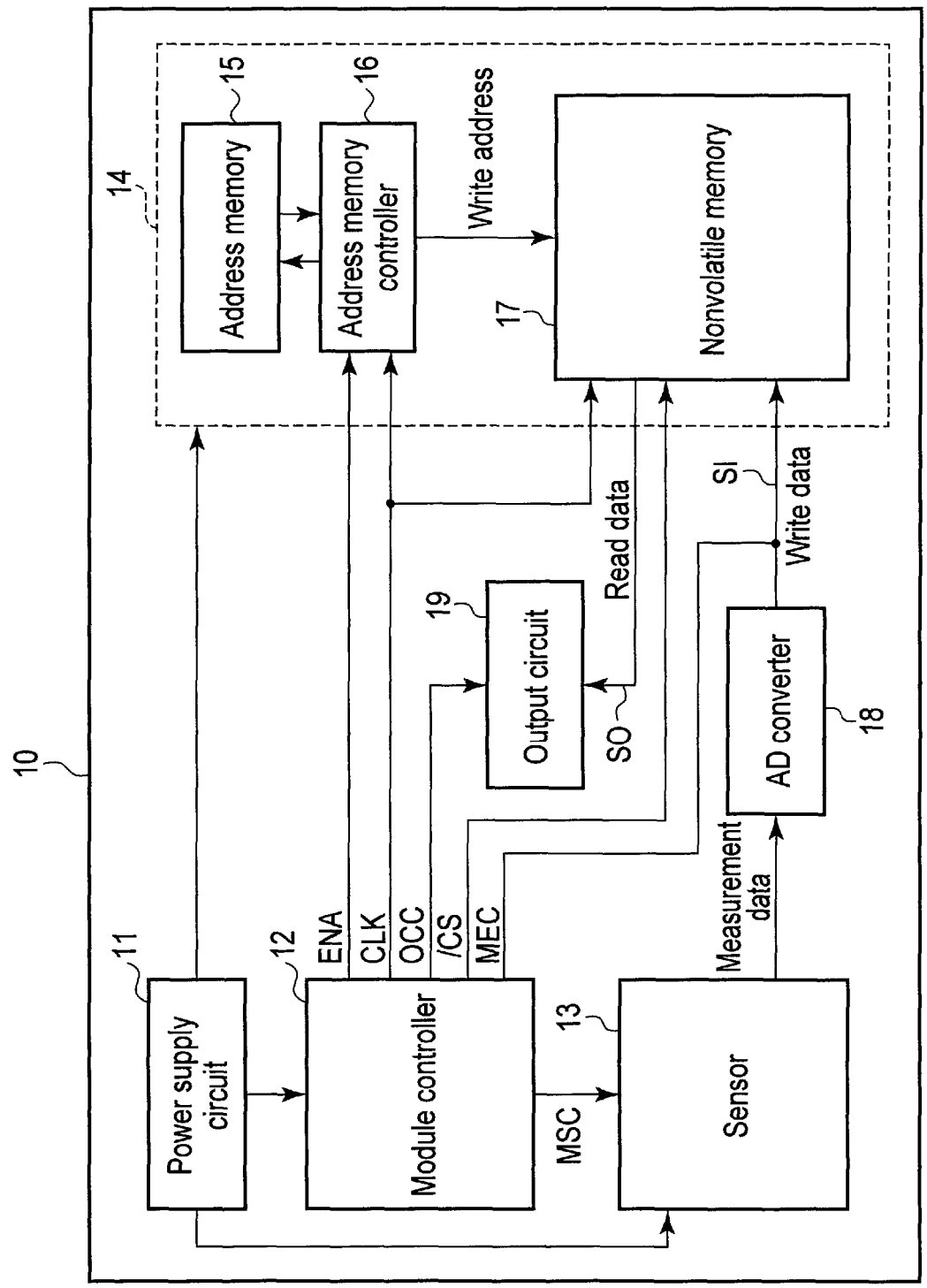
FIG. 18 is a block diagram of a memory system according to a sixth embodiment.

FIG. 18 is a block diagram of a memory system 10 according to the sixth embodiment. The memory system 10 includes the power supply circuit 11, the module controller 12, the sensor 13, and the memory device 14. The memory system 10 may further include an AD converter 18 and/or an output circuit 19. The memory device 14 includes the address memory 15, the address memory controller 16, and the nonvolatile memory 17. In the sixth embodiment, the nonvolatile memory 17 is configured to operate in accordance with an interface which transmits data serially. Specifically, the nonvolatile memory 17 is configured to recognize commands based on an interface which transmits data serially, and receive and output data in accordance with such an interface. The interface which transmits data serially is referred to as a serial transmission interface herein. Examples of the serial transmission interface include a serial peripheral interface (SPI) and inter-integrated circuit (I²C) interface. The serial transmission interface is suitable for small data transmission and can transmit less data than in a case of parallel data transmission within the same period and consumes less power.

Figure 19:
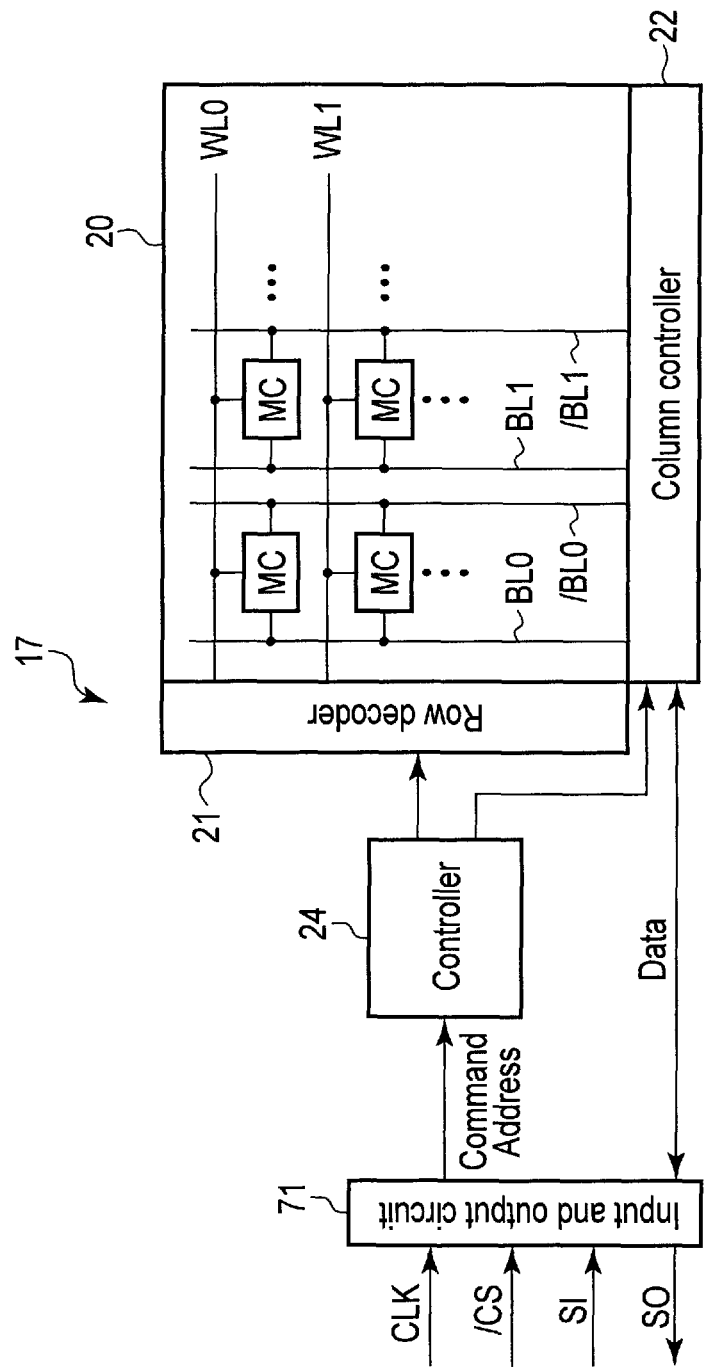
FIG. 19 is a block diagram of a nonvolatile memory according to the sixth embodiment.

FIG. 19 is a block diagram of the nonvolatile memory 17 according to the sixth embodiment. The nonvolatile memory 17 is an MRAM as in the first embodiment, for example. The MRAM 17 operates in accordance with the serial transmission interface as described above. In accordance with this, the MRAM 17 includes an input/output circuit 71 instead of the input/output circuit 23 of the first embodiment. The input/output circuit 71 supports the serial transmission interface. Specifically, the input/output circuit 71 receives a serial signal on a signal line SI, receives a chip (or, memory) enable signal /CS, and receives the clock CLK. The input/output circuit 71 transmits a serial signal to the output circuit 19 on a signal line SO.

On the signal line SI, a signal, such as commands, addresses, and data, flows toward the input/output circuit 71. FIG. 20 illustrates an example of the flow of the signal on the signal line SI, chip enable signal /CS and clock CLK in accordance with a serial transmission interface. The nonvolatile memory 17 is enabled while a signal /CS remains asserted. FIG. 20 relates to an example of a write. In the write based on the serial transmission interface, commands, addresses, and data all flow on the signal line SI. The nonvolatile memory 17 takes in the signal on the signal line SI in units of bytes (each byte including eight bits) in synchronization with the write clock CLK.

The nonvolatile memory 17 receives a write command, an address, and data on the signal line SI as illustrated in FIG. 20. The write command instructs a data write, and is illustrated as 02h as an example, and has a size of one byte, for example. The address specifies memory cells MC in which data will be written among the memory cells MC of the nonvolatile memory 17, and is referred to as a write address. The data are data which will be written, and has a size of one byte, for example. FIG. 20 illustrates a case of a write to the nonvolatile memory 17 with a capacity of 1 G bits. In accordance with this, a write address indicates the write-target address by four bytes. In such context, six bytes of a signal (a command, an address, and data) need to be transmitted for a write of one-byte data.

On the signal line SO, the signal, such as data, flows out of the input/output circuit 71. During a read, read data from the memory cells MC flows on the signal line SO.

Referring back to FIG. 18, the nonvolatile memory 17 operates in accordance with the serial transmission interface as described above. In accordance with this, the module controller 12 is also configured to operate in accordance with the serial transmission interface, and it operates in accordance with the same interface as that of the nonvolatile memory 17. Specifically, the module controller 12 is configured to generate commands based on the serial transmission interface, and receive and output data in accordance with such an interface. In accordance with the difference in the interface, the module controller 12 of the sixth embodiment outputs signals different from those in the first embodiment.

Specifically, the module controller 12 outputs a signal /CS, and transmits the memory control signal MEC, such as a command and an address, to the nonvolatile memory 17 on the signal line SI.

The write data from the sensor 13 are transmitted to the nonvolatile memory 17 on the signal line SI. The address memory 15 can store the address information in accordance with the Gray code in accordance with other embodiments, or in any other form. For the case of storing based on the Gray code, the address memory controller 16 has the features described in the first to fifth embodiments. For the case of the address information not being stored in the form based on other embodiments, the address memory controller 16 merely increments the value of the address information in the address memory 15 by a particular amount (for example, 1) to generate a write address.

Figure 21:
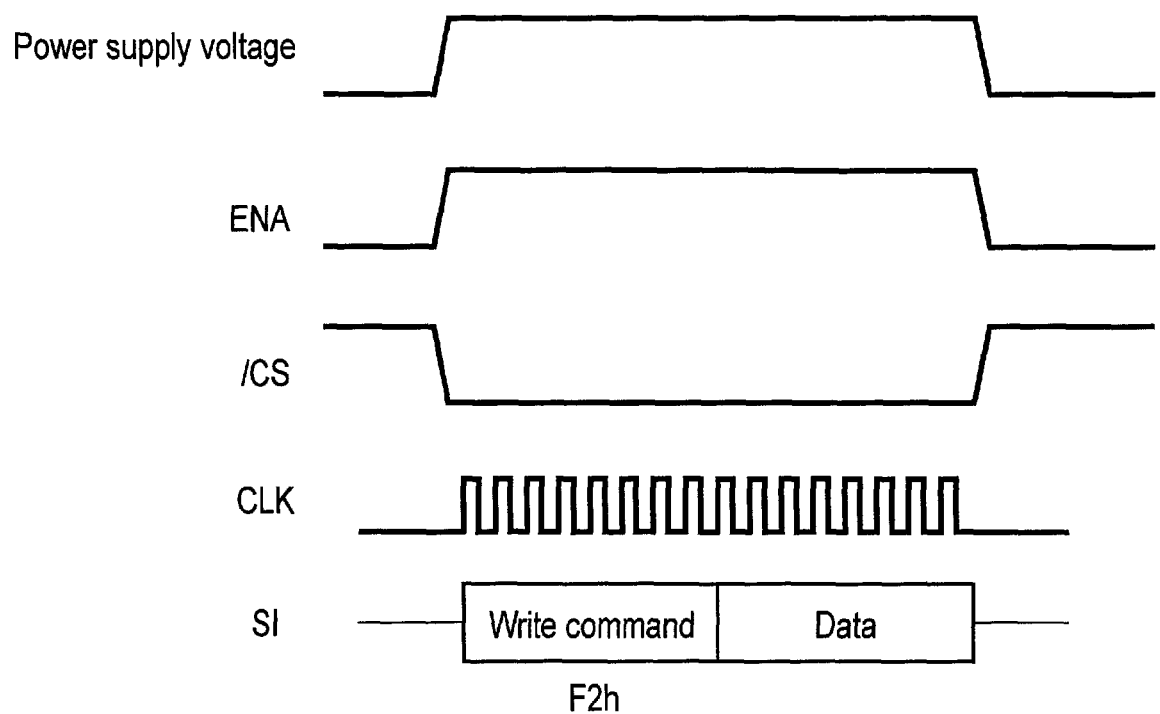
FIG. 21 illustrates signals transmitted and received between a module controller and the nonvolatile memory in the sixth embodiment.

Referring to FIG. 21, the operation of the memory system 10 will now be described. FIG. 21 illustrates signals transmitted and received between the module controller 12 and the nonvolatile memory 17 in the sixth embodiment.

As in the first embodiment, when the memory system 10 is turned on, the module controller 12 asserts the signals /CS and ENA. The module controller 12 then generates the write clock CLK, and executes operations described in the following in synchronization with the write clock CLK.

As described in the first embodiment, a write address can be generated by the address memory controller 16 from the address information in the address memory 15. For this reason, the module controller 12 does not need to transmit a write address to the nonvolatile memory 17. Therefore, the module controller 12 writes data in the nonvolatile memory 17 without specifying a write address. The module controller 12 transmits a second write command to the nonvolatile memory 17 on the signal line SI. The second write command (no-address write command) is different from the regular write command accompanied by a write address of FIG. 20, and is illustrated by a value, for example, F2h, which is different from that for the regular write command for the purpose of distinction from the regular write command. The second write command instructs for the following signal to be recognized as the write data, and for the write data to be written in a write address received separately.

The module controller 12 controls the sensor 13 to make it transmit the write data on the signal line SI following the second write command. The module controller 12 does not transmit a write address. The module controller also asserts the signal ENA in parallel with or after the transmission of the second write command. In response to the asserted signal ENA, the address memory controller 16 generates a write address from the address information and supplies the generated write address to the nonvolatile memory 17.

When the nonvolatile memory 17 receives the second write command, it recognizes the second write command and executes the operation instructed by the second write command. Specifically, the nonvolatile memory 17 writes the data received after the second write command in the memory cells MC specified by the write address received from the address memory controller 16.

For additional data writes, the operation described so far is repeated. Specifically, the module controller 12 maintains the asserted enable signal /CS and keeps outputting the write clock CLK. While the nonvolatile memory 17 keeps receiving the asserted enable signal /CS and the write clock CLK, it sequentially writes write data being received during the period. Specifically, the module controller 12 controls the sensor 13 to make it transmit additional write data on the signal line SI. The nonvolatile memory 17 keeps incrementing the write-target address by a unit amount and consecutively writes the write data items being received. The module controller 12 does not need to transmit a write command every time of write of write data.

When a series of writes is completed, the module controller 12 negates the enable signal ENA and writes the last address in the current series of write accesses as the address information in the address memory 15 as in the first embodiment. The module controller 12 then stops the power supply by the power supply circuit 11.

As described, in the sixth embodiment, the address information is stored, and the nonvolatile memory 17 and the module controller 12 use the serial transmission interface and support a write command which does not require transmission of a write address. A write address is separately generated from the address information, and, therefore, does not need to be transmitted from the module controller 12. For this reason, the signal transmitted to the nonvolatile memory 17 from the module controller 12 for a data write only includes a command and data, and has a size of two bytes in total according to the FIG. 21 example. This quantity is smaller than that of the regular write command (FIG. 20). A reduced time of transmission of the signal results in decreased power consumption by the memory system 10.

Seventh Embodiment

The seventh embodiment relates to an example of application a particular interface to the memory system 10, and is applicable to any of the first to sixth embodiments.

Figure 22:
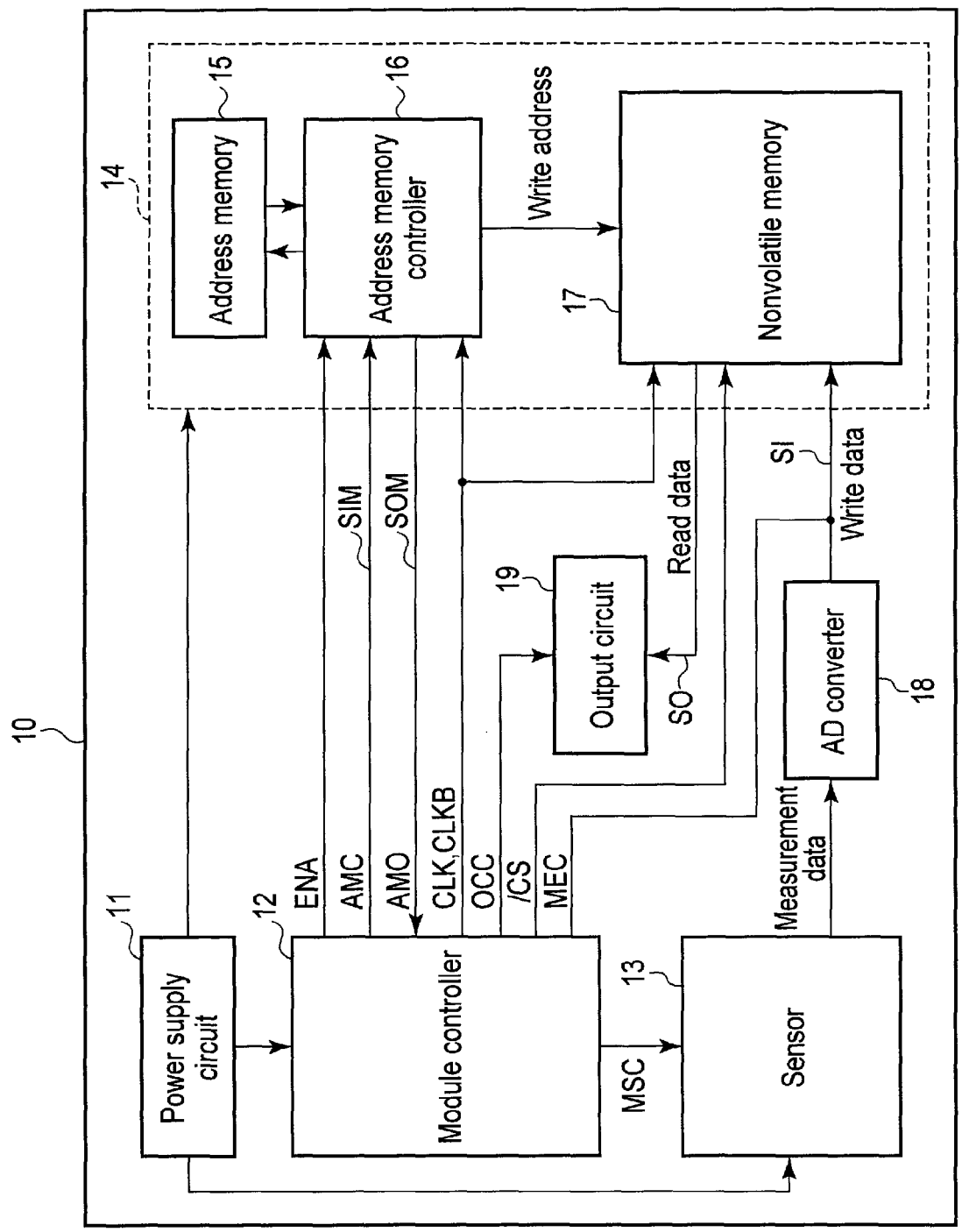
FIG. 22 is a block diagram of a memory system according to a seventh embodiment.

FIG. 22 is a block diagram of the memory system 10 according to the seventh embodiment. In the seventh embodiment, the address memory controller 16 is configured to operate in accordance with the serial transmission interface. Specifically, the address memory controller 16 is configured to recognize commands based on the serial transmission interface, and receive and output data in accordance with such an interface. In accordance with the address memory controller 16 using the serial transmission interface, the module controller 12 also operates in accordance with the same serial transmission interface. Specifically, the module controller 12 outputs the enable signal ENA, and transmits a memory control signal AMC, such as a command and an address, to the address memory controller 16 on a signal line SIM. The address memory controller 16 is enabled while the enable signal ENA remains asserted. Moreover, the module controller 12 receives an output AMO from the address memory controller 16 on a signal line SOM. For a case of the address memory 15 being implemented by some of the functions of the nonvolatile memory 17, the signal lines SIM and SOM are identical with the signal lines SI and SO, respectively.

The nonvolatile memory 17 may or may not be based on the serial transmission interface. FIG. 22 illustrates an example where the nonvolatile memory 17 is based on the serial transmission interface as in the sixth embodiment.

Figure 23:
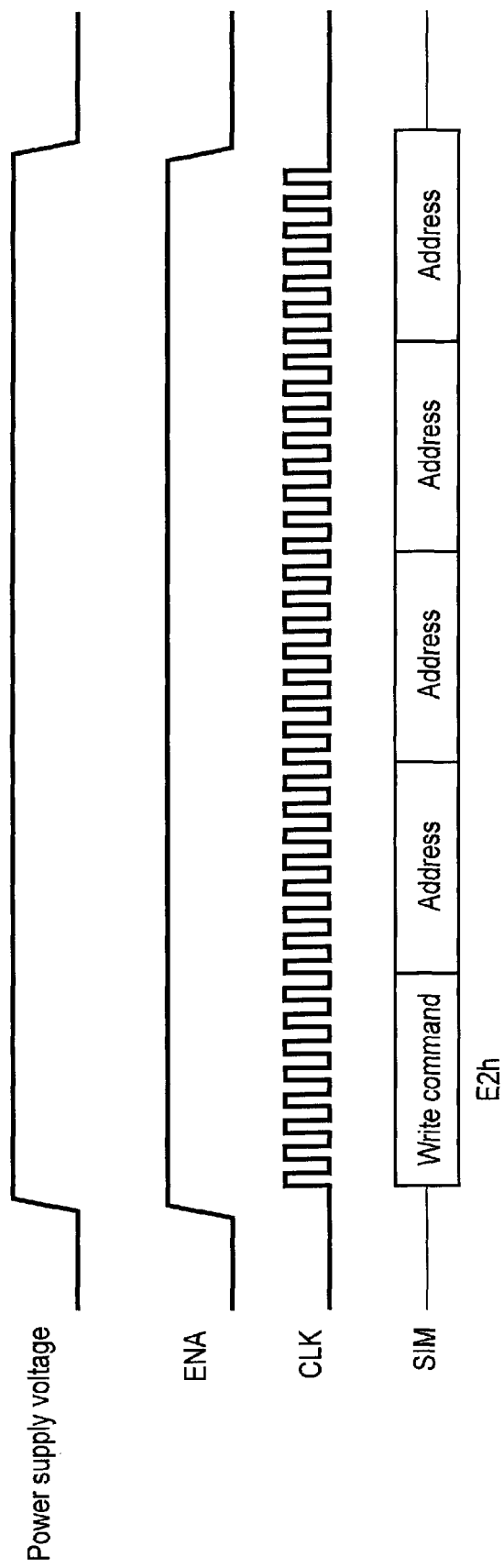
FIG. 23 illustrates signals transmitted and received between a module controller and an address memory controller in the seventh embodiment.

FIG. 23 illustrates signals transmitted and received between the module controller 12 and the address memory controller 16 in the seventh embodiment. Update of the address information in the address memory 15 may be requested. The update request is made from outside the memory system 10 to the module controller 12, for example. The update request is received with the new address information.

When address information update is requested, the module controller 12 asserts the enable signal ENA, outputs the write clock CLK, and transmits an address write command (write address write command) to the address memory controller 16 on the signal line SIM. The address write command is different from the write command 02h and F2h, is illustrated by FIG. 23 as E2h, and has a size of one byte, for example. The module controller 12 transmits the value of the new address to the address memory controller 16 on the signal line SIM after the address write command. The address has a size of four bytes, for example.

When the address memory controller 16 receives the address write command, it recognizes the address write command and executes the operation instructed by the address write command. Specifically, the address memory controller 16 updates the value in the address memory 15 with the value of the address received from the module controller 12. When the update of address information is completed, the module controller 12 negates the enable signal ENA.

The writes are the same as those in other embodiments. Specifically, when a data write occurs, the module controller 12 executes the write in accordance with the address information last updated by the address write command.

Furthermore, the address information in the address memory 15 may be requested from outside the memory system 10. The request of read of address information is made from outside the memory system 10 to the module controller 12, for example. In order to deal with such a request, an address read command can be defined. FIG. 24 illustrates the second example of signals transmitted and received between the module controller 12 and the address memory controller 16 in the seventh embodiment.

When a read of the address information is requested, the module controller 12 asserts the enable signal ENA, outputs the read clock CLKB, and transmits an address read command (write address read command) to the address memory controller 16 on the signal line SIM. The address read command is different from the regular read command accompanied by a read address, and is illustrated by FIG. 24 as E3h, and has a size of one byte, for example. A read address specifies the memory cells MC from which data will be read among the memory cells MC of the nonvolatile memory 17.

When the address memory controller 16 receives the address read command, it recognizes the address read command and executes the operation instructed by the address read command. Specifically, the address memory controller 16 reads the address information in the address memory 15, and transmits the read address information to the module controller 12 on the signal line SOM. The module controller 12 outputs the received address information to outside the memory system 10 through control of the output circuit 19 when necessary. FIG. 24 illustrates an example where the address information has a size of four bytes. When the read of address information is completed, the module controller 12 negates the enable signal ENA.

As described, according to the seventh embodiment, the address information can be written from outside the memory system 10 by the address write command. Moreover, the address information can be accessed from outside the memory system 10 by the address read command.

Eighth Embodiment

The eighth embodiment relates to an example of application of a particular interface to the memory system 10, and is applicable to any of the first to seventh embodiments.

FIG. 25 is a block diagram of the memory system 10 according to the eighth embodiment. The module controller 12, the address memory controller 16, and the nonvolatile memory 17 operate in accordance with the serial transmission interface as in the sixth and seven embodiments.

The memory device 14 of the eighth embodiment further includes a second address memory 15b and a second address memory controller 16b. The second address control circuit 16b can have the same components and connections as the address memory controller 16, and operates in accordance with the serial transmission interface. The second address memory controller 16b receives a signal ENAB, the write clock CLK, and the read clock CLKB from the module controller 12 and receives a memory control signal AMCB, such as a command and an address on the signal line SIMB. Moreover, the second address memory controller 16b supplies an output AMOB to the module controller 12 on a signal line SOMB. For a case of the second address memory 15b being implemented by some of the functions of the nonvolatile memory 17, the signal lines SIMB and SOMB are identical with the signal lines SI and SO, respectively.

The second address memory 15b can have the same features as the address memory 15, and in that case the description for the address memory 15 is applicable.

Data in the nonvolatile memory 17 may be read to outside the nonvolatile memory 17 at a particular timing. A read is executed for output to outside the memory system 10, for example, as described in the first embodiment. For example, the module controller 12 starts a read of data from the nonvolatile memory 17 based on an instruction from outside the memory system 10 or a predetermined timing (for example, based on a timer).

Similarly to writes, consecutive reads may be executed from more than one area with consecutive addresses of the nonvolatile memory 17. In such a case, when the address of the area from which the data was read last is specified, the address which follows or is based on the specified address is used as the start position, and a read address does not need to be specified separately. The serial transmission interface of the eighth embodiment or other embodiments supports consecutive reads from areas with consecutive addresses of the nonvolatile memory 17 with a specification reduced from the regular read accompanied by read addresses. For example, when the nonvolatile memory 17 which supports such a serial transmission interface receives the read clock CLKB while it keeps receiving the asserted enable signal /CS, it keeps incrementing the address from the start position by a unit amount and reads data consecutively from the resultant addresses. The I²C, for example, supports such a read.

For such a read, if the read address of the start position is specified, read addresses do not have to be individually specified. Based on this, the read address from which the data was read last is stored in the second address memory 15b as in the write. The second address memory 15b can store the address information in accordance with the Gray code in accordance with other embodiments or in any other form.

The module controller 12 supplies the read clock CLKB to the nonvolatile memory 17 and the second address memory 15b. Moreover, the module controller 12 supplies the enable signal ENAB to the second address memory controller 16b. Furthermore, the module controller 12 transmits a memory control signal AMC, such as a command and an address, to the address memory controller 16 on a signal line SIMB.

Figure 26:
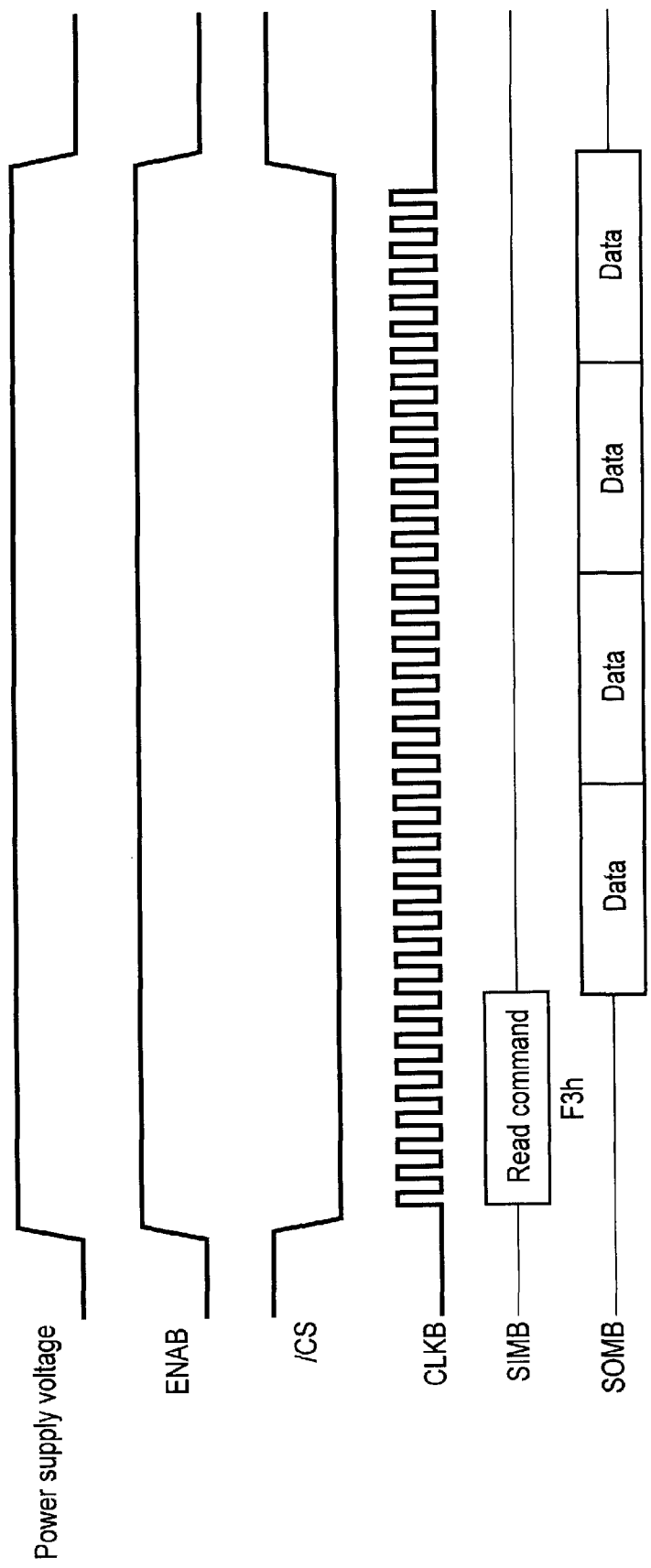
FIG. 26 illustrates signals transmitted and received between a module controller and a second address memory controller in the eighth embodiment.

Referring to FIG. 26, operation of the memory system 10 will now be described. FIG. 26 illustrates signals transmitted and received between the module controller 12 and the second address memory controller 16b in the eighth embodiment. The module controller 12 starts a read of data from the nonvolatile memory 17 at a particular timing. For that purpose, the module controller 12 asserts the signal /CS and ENAB, outputs the read clock CLKB, and transmits a second read command (no address read command) to the nonvolatile memory 17 on the signal line SI. The second read command is different from the regular read command accompanied by a read address, and is illustrated by F3h, for example. The second read command instructs using a read address received separately as the start position to read data consecutively from the start address and the following addresses. The module controller 12 transmits no address value to the nonvolatile memory 17 after the second read command.

The read address of the start position is generated by the address memory controller 16 from the address information in the second address memory 15b. Specifically, when the second address memory controller 16 receives an asserted enable signal ENAB, it reads the address information in the second address memory 15b. As described above, the address information in the second address memory 15b indicates the address of the area of the nonvolatile memory 17 from which the data was read last. When the second address memory controller 16 receives the address information in the second address memory 15b, it increments the received address information by a particular amount (for example, 1) to generate a read address. The second address memory controller 16 transmits the generated read address to the nonvolatile memory 17.

When the nonvolatile memory 17 receives the second read command, it recognizes the second read command and executes the operation instructed by the second read command. Specifically, the nonvolatile memory 17 reads data from the read address received from the second address memory controller 16b, and transmits the read data of one byte to the output circuit 19. For additional reads, the module controller 12 maintains the asserted enable signal /CS and keeps outputting the read clock CLKB. While the nonvolatile memory 17 keeps receiving the asserted enable signal /CS and the read clock CLKB, it executes consecutive reads. Specifically, the nonvolatile memory 17 keeps incrementing the read target address by a unit amount and reads data from the resultant addresses. FIG. 26 illustrates a case of a read started from one read address, and four bytes read data are output in this way.

When a series of reads is completed, the module controller 12 negates the enable signal ENAB as in the write. When the enable signal ENAB is negated, the second address memory controller 16b writes the address information in the second address memory 15b. The address information written in the second address memory 15 here is the last address of a series of the read accesses, and will be read to be the initial value when the enable signal ENAB is asserted the next time. The module controller 12 then stops the power supply by the power supply circuit 11.

Furthermore, the second read command may instruct the output of data after a lapse of a particular period, as a variation. FIG. 27 illustrates signals transmitted and received between the module controller and the address memory controller in the second example of the eighth embodiment. For convenience, the second read command of FIG. 27 is referred to as a third read command, and is illustrated by D3h, for example.

The nonvolatile memory 17 may receive a clock of a high frequency. For example, the nonvolatile memory 17 receives the read clock CLKB of a high frequency from the module controller 12. In such a case, the nonvolatile memory 17 may not be ready for outputting read data right after the reception of the read command. In order to address such a case, a read command which instructs data output after a lapse of a fixed period after the read command may be defined. Such a read command is different from the regular read command, and it corresponds to a FAST read command in the SPI. The third read command corresponds to such a read.

When the nonvolatile memory 17 receives the third read command, it recognizes the third read command and executes the operation instructed by the third read command. Specifically, the nonvolatile memory 17 first waits for a particular period. The wait time may be set in advance or dynamically. After the lapse of the wait time (or, dummy cycle) after the receipt of the third command, the nonvolatile memory 17 reads data from the read address received from the second address memory controller 16b, and transmits the read data to the output circuit 19. FIG. 27 illustrates an example of the dummy cycle being eight clocks or equal to a period for transmitting eight bits.

As described, according to the eighth embodiment, the read address generated from the second address memory 15b is used to execute the read, and therefore the input of the read address accompanying the read command is unnecessary. For this reason, reads can be executed with little power consumption.

Ninth Embodiment

The ninth embodiment is based on the eighth embodiment. In the ninth embodiment, there is provided a mechanism to update and/or read the address information in the second address memory 15b. The block diagram of the memory system 10 according to the ninth embodiment is the same as that of the eighth embodiment (FIG. 25).

In the ninth embodiment, the module controller 12 is configured to execute the operation described in the following.

Figure 28:
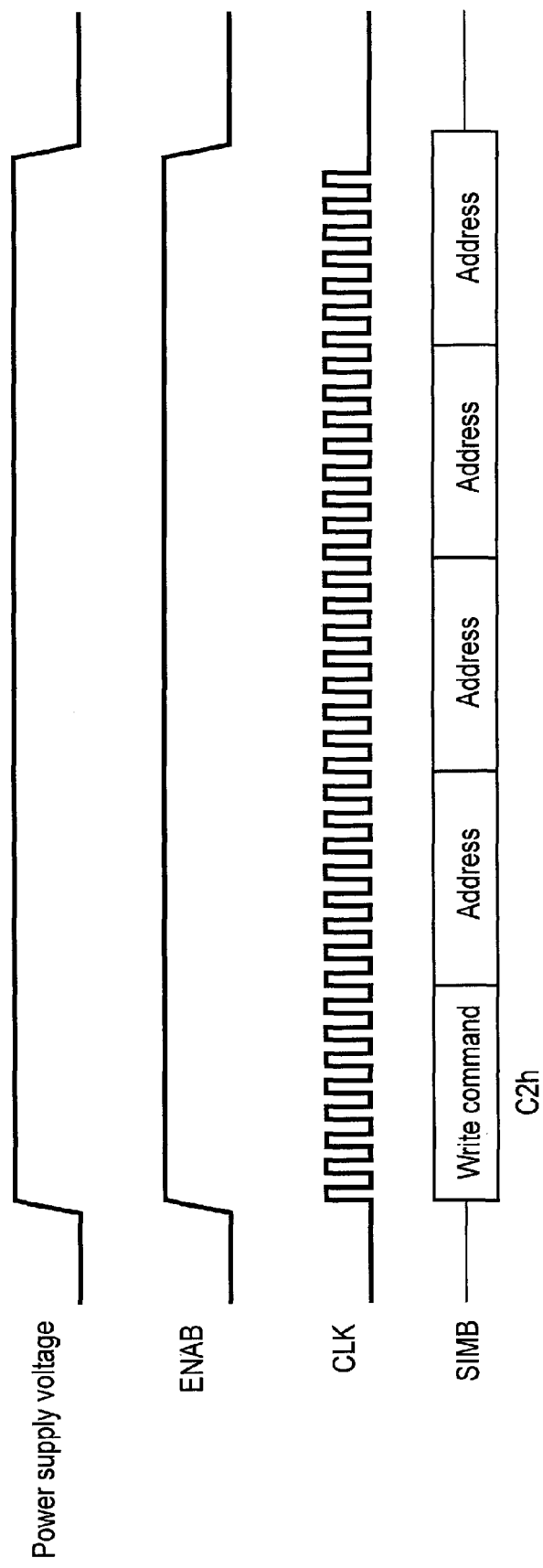
FIG. 28 illustrates signals transmitted and received between a module controller and a second address memory controller in a ninth embodiment.

FIG. 28 illustrates signals transmitted and received between the module controller 12 and the second address memory controller 16b in the ninth embodiment. The update of the address information in the second address memory 15b may be requested. The update request is made from outside the memory system 10 to the module controller 12, for example. The update request is received with new address information.

When address information update is requested, the module controller 12 asserts the enable signal ENAB, outputs the write clock CLK, and transmits a second address write command (read address write command) to the second address memory controller 16b on the signal line SIB. The second address write command is different from the regular write command and the address write command, and is illustrated by FIG. 28 as C2h, and has a size of one byte, for example. The module controller 12 transmits the value of the new address to the second address memory controller 16b on the signal line SIMB after the second address write command. The address has a size of four bytes, for example. When the second address memory controller 16b receives the second address write command, it updates the value in the second address memory 15b with the value of the address received from the module controller 12. When the update of address information is completed, the module controller 12 negates the enable signal ENA.

Furthermore, the address information in the second address memory 15b may be requested from outside the memory system 10. The request of read of address information is made from outside the memory system 10 to the module controller 12, for example.

In order to deal with such a request, a second address read command can be defined. FIG. 29 illustrates signals transmitted and received between the module controller 12 and the second address memory controller 16b in the second example of the ninth embodiment.

When a read of the address information is requested, the module controller 12 asserts the enable signal ENAB, outputs the read clock CLKB, and transmits the second address read command (read address read command) to the second address memory controller 16b on the signal line SIB. The second address read command is different from the usual read command and the address read command, and is illustrated by FIG. 29 as C3h, and has a size of one byte, for example.

When the second address memory controller 16b receives the second address read command, it recognizes the second address read command, reads the address information in the second address memory 15b, and transmits the read address information to the module controller 12 on the signal line SOMB. FIG. 29 illustrates an example of the address information of four bytes. When the read of address information is completed, the module controller 12 negates the enable signal ENA.

As described, according to the ninth embodiment, the address information in the second address memory 15b can be written from outside the memory system 10 by the second address write command. Moreover, the address information in the second address memory 15b can be accessed from outside the memory system 10 by the second address read command.

Tenth Embodiment

The tenth embodiment relates to an error correction technique.

An error correction technique may be used with a memory device. In this case, a circuit to execute an error correction technique, or an error correction circuit, is provided along with a memory device. The error correction circuit receives write data to be written in the memory device, follows predefined rules for generating an error correction code to generate an error correction code (parity), and outputs the set of write data and parity. The memory device stores the set of write data and parity. Moreover, the error correction circuit receives a set of read data requested to be read and parity, uses the parity to correct an error in the read data, and outputs the error-corrected read data.

As an error correction code, a Hamming code is known. The operation for generating the Hamming code generates a four-bit parity from eight-bit information (substantial data), and, as a result, generates a twelve-bit code in total, which is a set of information and parity. In other words, the error correction using the Hamming code can correct any one-bit error in an array of twelve bits, but cannot correct errors of two bits or more.

A BCH code is known as a code which can correct errors of more bits than with the Hamming code. The operation for generating the BCH code to correct errors of k bits in the information of the length of $2^m-1$ (m being an integer) results in information length=code length−k×m. For example, m=4 and k=2 results in the information length of seven bits for the code length of fifteen bits, and therefore the maximum number of correctable bits with eight-bit parity is seven-bit information. With m=5 and sixteen-bit code length, the information length is only 16−m×k=6 bits.

In contrast, the error correction technique of the tenth embodiment uses a parity generation matrix of FIG. 30. FIG. 30 illustrates an example of the parity generation matrix according to the tenth embodiment. The parity generation matrix has components of eight rows and eight columns. In a parity generation matrix of the tenth embodiment, the set of components in a particular column has a set of components in an adjacent column with the components cyclically shifted by one row. Specifically, the value at the $n^{th}$ row in the $m^{th}$ column is the same as that at the $(n+1)^{th}$ row in the $(m+1)^{th}$ column. Moreover, the value at the eighth row in the $m^{th}$ column is the same as that at the first row in the $(m+1)^{th}$ column, and eight values are cyclically shifted by one row over the eight columns. Moreover, the value at the $n^{th}$ row in the eighth column is the same as that at the $(n+1)^{th}$ row in the first column. The value at the eighth row in the eighth column is the same as that at the first row in the first column.

As illustrated in FIG. 30, the first column has values of 1, 1, 1, 0, 1, 0, 0, and 0 at the first to eighth rows, respectively. The second to eighth columns have components determined in accordance with the rules described above.

Referring to an instance of FIG. 31, generation of error correction code according to the tenth embodiment will now be described. FIG. 31 illustrates an example of the operation to generate the parity according to the tenth embodiment, and illustrates an example of parity generation using the parity generation matrix of FIG. 30. Data have a size of eight bits and values of D7, D6, D5, D4, D3, D2, D1, and D0 from the most significant bit to the least significant bit, respectively. In order to generate the parity of this data, data is treated as a matrix of eight rows and one column. Specifically, the data matrix has values of D0, D1, D2, D3, D4, D5, D6, and D7 in the first to eighth rows, respectively. Such a data matrix and the parity generation matrix are multiplied to result in a parity matrix of eight rows and one column. The parity matrix has values of P0, P1, P2, P3, P4, P5, P6, and P7 in the first to eighth rows, respectively. Specifically, in the FIG. 31 example, value P0 is D0+D4+D6+D7, and is the exclusive OR of D0, D4, D6, and D7. Similarly, the other results are P1=D0+D1+D5+D7, P2=D0+D1+D2+D6, P3=D1+D2+D3+D7, P4=D0+D2+D3+D4, P5=D1+D3+D4+D5, P6=D2+D4+D5+D6, and P7=D3+D5+D6+D7. The resultant eight-bit data and the eight-bit parity are concatenated to be treated as an array of sixteen bits in total.

Error correction according to the tenth embodiment will now be described with reference to the instances of FIGS. 32 and 33. FIG. 32 illustrates an example of the decryption matrix according to the tenth embodiment, and illustrates the example of the decryption matrix based on the FIG. 31 example. FIG. 33 illustrates the operation for the error correction with the decryption matrix of FIG. 32. As illustrated in FIG. 32, a decryption matrix of the tenth embodiment has components in eight rows and sixteen columns. The first to eighth columns of the decryption matrix are the same as the first to eighth columns of the parity generation matrix of FIG. 30, and the ninth to sixteenth columns of the decryption matrix are a unit matrix of eight rows and eight columns. As illustrated in FIG. 33, the decryption matrix of FIG. 32 is multiplied with the sixteen bits of data and parity obtained by the operation of FIG. 30. The data and parity are treated in the form of a matrix of sixteen rows and one column. Specifically, the data and parity bits have values D0, D1, D2, D3, D4, D5, D6, D7, P0, P1, P2, P3, P4, P5, P6, and P7 in the first to sixteenth rows, respectively. The multiplication results in a syndrome matrix of eight rows and one column. The syndrome matrix has values S0, S1, S2, S3, S4, S5, S6, and S7 in the first to eighth rows, respectively.

When there is no error in the sixteen-bit data and parity, the syndrome matrix is a zero matrix, i.e., S0=S1=S2=S3=S4=S5=S6=S7=0. In contrast, when data and parity include a one-bit error, the syndrome matrix has value of one at the components at the positions determined in accordance with the position of the error. Specifically, when value D0 includes the error, the syndrome matrix is the same as the first column of the decryption matrix. Similarly, when values D1, D2, D3, D4, D5, D6, D7, P0, P1, P2, P3, P4, P5, P6, and P7 include the error, the syndrome matrix is the same as the second to sixteenth columns of the decryption matrix, respectively. For example, when value P0 is erroneous, the syndrome matrix has 1, 0, 0, 0, 0, 0, 0, and 0 in the first to eighth rows, respectively. When value D3 is erroneous, the syndrome matrix has 0, 0, 0, 1, 1, 1, 0, and 1 in the first to eighth rows, respectively.

Furthermore, when the data and parity include two-bit errors, the resultant syndrome matrix is an exclusive OR (XOR) of two columns in the decryption matrix corresponding to the positions of the erroneous bits. For example, when values D0 and D1 are erroneous, the syndrome matrix has, in the first to eighth rows, respectively, 1, 0, 0, 1, 1, 1, 0, and 0, which are XOR of the respective components of the corresponding set of 1, 1, 1, 0, 1, 0, 0, and 0 and the other corresponding set of 0, 1, 1, 1, 0, 1, 0, and 0.

In general, the parity generation matrix of the tenth embodiment includes components such that the XOR of any two of sixteen columns of the decryption matrix including that parity generation matrix and a unit matrix is different from the XOR of any other two columns and any of sixteen columns of the decryption matrix.

Thus, the error correction technique of the tenth embodiment uses the parity generation matrix, the decryption matrix, and the operation of FIGS. 30 to 33. As described above, while the Hamming code cannot correct two-bit errors in eight-bit data, the error correction technique of the tenth embodiment can correct two-bit errors in eight-bit data. The error correction technique with the BCH code can correct two-bit errors in eight-bit data, but the correction in such a case requires ten-bit parity. In contrast, the error correction technique of the tenth embodiment can correct two-bit errors in eight-bit data with eight-bit parity.

The error correction technique of the tenth embodiment can be used with a memory device. Specifically, an error correction circuit of the tenth embodiment receives write data, generates parity from the write data in accordance with the error correction technique of the tenth embodiment, and outputs the set of the write data and the parity. Moreover, the error correction circuit of the tenth embodiment receives the set of read data and parity, uses the error correction technique of the tenth embodiment and the parity to correct an error in the read data, and outputs the error-corrected read data.

The error correction circuit of the tenth embodiment is applicable to the first to ninth embodiments, and this will be described with reference to an instance below. In general, error correction circuits including one according to the tenth embodiment may be provided in the chip of a memory device or outside the memory chip. An example where the error correction circuit is provided in the chip of a memory device in accordance with the first embodiment (FIG. 17) will be described with reference to FIG. 34. FIG. 34 is a block diagram of the nonvolatile memory 17 according to the tenth embodiment.

The nonvolatile memory 17 includes an error correction circuit 27 between the column controller 22 and the input and output circuit 23. The error correction circuit 27 uses the error correction technique of the tenth embodiment, i.e., the error correction technique with the parity generation matrix, the decryption matrix, and the operation of FIGS. 30 to 33, to correct errors in data. Specifically, the error correction circuit 27 receives write data from the input and output circuit 23, uses the error correction technique of the tenth embodiment to generate parity from the write data, and outputs the set of write data and parity to the column controller 22. Moreover, the error correction circuit 27 receives the set of read data and parity from the column controller 22, corrects an error in the read data based on a syndrome obtained through the read data and parity and the error correction technique of the tenth embodiment, and outputs error-corrected read data to the input and output circuit 23.

Although the information length is as short as eight bits in length, the error correction circuit 27 can correct two-bit errors in data through addition of eight-bit parity. The number of bits of parity is fewer than in the case of the BCH code. For this reason, the error correction circuit 27 is useful for an application which treats small data with low power, and the first to ninth embodiments correspond to such application.

The parity generation matrix of FIG. 30 is an example, and the parity generation matrix of the tenth embodiment is not limited to that of FIG. 30. The parity generation matrix can include components different from those in the FIG. 30 example as long as the parity generation matrix of the tenth embodiment includes components such that the XOR of any two of sixteen columns of the decryption matrix including that parity generation matrix and a unit matrix is different from the XOR of any other two columns and any of sixteen columns of the decryption matrix. The inventor confirmed existence of at least 5040 parity generation matrices which fulfill such conditions. FIGS. 35 to 39 illustrate examples of five parity generation matrices among them. FIGS. 35 to 37, in particular, illustrate examples of a cyclic type, where a set of components in a particular column is the same as the one-row-cyclically-shifted version of the set of components in an adjacent column. FIG. 38 and FIG. 39 illustrate examples of a non-cyclical type.

As described, the parity generation matrix of the tenth embodiment includes components such that the XOR of any two of sixteen columns of the decryption matrix including that parity generation matrix and a unit matrix is different from the XOR of any other two columns and any of sixteen columns of the decryption matrix. The use of such parity generation matrix and decryption matrix can correct two-bit errors in eight-bit data. Specifically, the error correction technique of the tenth embodiment exhibits a higher error-correction capability than the capability of the Hamming code through the use of the parity of bits fewer than the bits of parity required by the BCH code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
memory cells;
an error correction circuit; and
a controller,
wherein, in a write operation:
the error correction circuit receives data to be written to the memory cells, and uses the data and a first matrix to generate a parity, and
the controller writes the data and the parity to the memory cells;
wherein, in a read operation:
the controller reads, from the memory cells, data and parity previously written, and supplies the read data and parity to the error correction circuit,
the error correction circuit receives the read data and parity, and uses the read data and parity and a second matrix to generate a syndrome, and
the error correction circuit uses the syndrome to detect an error of the read data and parity, and to correct an error of the read data when the read data and parity include one-bit or two-bit errors,
wherein the second matrix includes a first and a second portion, the first portion being identical to the first matrix, and the second portion being a unit matrix, and
wherein an XOR of any two columns of the second matrix is different from an XOR of any other two columns of the second matrix and any column of the second matrix.

2. The device of claim 1, wherein:
the first matrix comprises components in eight rows and eight columns, and
the second matrix comprises components in eight rows and sixteen columns.

3. The device of claim 2, wherein:
the data to be written comprises components in eight rows and one column, and
the error correction circuit multiplies the first matrix and the data to be written to generate the parity, the generated parity comprising eight rows and one column.

4. The device of claim 2, wherein:
the second matrix comprises the first matrix in first to eighth columns and the unit matrix in ninth to sixteenth columns,
the read data comprises components in eight rows and one column,
the error correction circuit multiplies the second matrix and an input which comprises the read data in first to eighth rows and the read parity in ninth to sixteenth rows to generate the syndrome, and
the syndrome comprises components in eight rows and one column.

5. The device of claim 4, wherein:
the first matrix comprises only components of one or zero, and
when the input has an error in a $k^{th}$ row (k being a natural number not greater than sixteen), the syndrome is the same as a $k^{th}$ column of the second matrix.

6. The device of claim 5, wherein:
when the input has errors in a $k^{th}$ row and $h^{th}$ row (h being a natural number different from k and not greater than sixteen), the syndrome is the same as an XOR of the $k^{th}$ column and an $h^{th}$ column of the second matrix.

7. The device of claim 2, wherein:
the first matrix comprises:
- in an $n^{th}$ row and an $m^{th}$ column, a same component as a component in an $(n+1)^{th}$ row and an $(m+1)^{th}$ column; and
- in an eighth row and the $m^{th}$ column, a same component as a component in a first row and an $(m+1)^{th}$ column, wherein each of m and n is a natural number not greater than seven.

* * * * *